(12) United States Patent
Uchida et al.

(10) Patent No.: US 12,480,025 B2
(45) Date of Patent: Nov. 25, 2025

(54) COMPOSITION

(71) Applicant: DENKA COMPANY LIMITED, Tokyo (JP)

(72) Inventors: Tometomo Uchida, Tokyo (JP); Toru Arai, Tokyo (JP); Takashi Domoto, Tokyo (JP); Takako Tanigawa, Tokyo (JP); Jun Watanabe, Tokyo (JP); Megumi Sudo, Tokyo (JP); Jun Yoshida, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 189 days.

(21) Appl. No.: 17/923,377

(22) PCT Filed: May 17, 2021

(86) PCT No.: PCT/JP2021/018671
§ 371 (c)(1),
(2) Date: Nov. 4, 2022

(87) PCT Pub. No.: WO2021/235406
PCT Pub. Date: Nov. 25, 2021

(65) Prior Publication Data
US 2023/0193090 A1    Jun. 22, 2023

(30) Foreign Application Priority Data

May 21, 2020 (JP) ................................ 2020-089229
Nov. 30, 2020 (JP) ................................ 2020-198857

(51) Int. Cl.
| | |
|---|---|
| *C09J 123/22* | (2006.01) |
| *C08F 2/44* | (2006.01) |
| *C08F 2/48* | (2006.01) |
| *C08F 20/20* | (2006.01) |
| *C08K 5/00* | (2006.01) |
| *C08K 5/101* | (2006.01) |
| *C09J 11/06* | (2006.01) |
| *H01L 21/02* | (2006.01) |

(52) U.S. Cl.
CPC .............. *C09J 123/22* (2013.01); *C08F 2/44* (2013.01); *C08F 2/48* (2013.01); *C08F 20/20* (2013.01); *C08K 5/0025* (2013.01); *C08K 5/101* (2013.01); *C09J 11/06* (2013.01); *H01L 21/02304* (2013.01); *H01L 21/0231* (2013.01)

(58) Field of Classification Search
None
See application file for complete search history.

(56) References Cited

U.S. PATENT DOCUMENTS

| | | | |
|---|---|---|---|
| 6,472,065 B1 * | 10/2002 | Alahapperuma | H01L 21/6836 428/343 |
| 8,232,350 B2 | 7/2012 | Fujita et al. | |
| 9,067,398 B2 * | 6/2015 | Kurimura | C09J 163/00 |
| 2009/0026934 A1 | 1/2009 | Fujita et al. | |
| 2009/0104448 A1 | 4/2009 | Thompson et al. | |
| 2009/0314417 A1 | 12/2009 | Sasaki et al. | |
| 2010/0038035 A1 | 2/2010 | Noda et al. | |
| 2010/0041211 A1 | 2/2010 | Noda et al. | |
| 2011/0105637 A1 | 5/2011 | Fujita et al. | |
| 2011/0230621 A1 | 9/2011 | Hildebrandt et al. | |
| 2012/0301639 A1 | 11/2012 | Grigorenko et al. | |
| 2013/0092326 A1 | 4/2013 | Goto et al. | |
| 2014/0103499 A1 | 4/2014 | Andry et al. | |
| 2017/0077440 A1 | 3/2017 | Yoo et al. | |
| 2017/0101560 A1 | 4/2017 | Mitsui et al. | |
| 2017/0365500 A1 | 12/2017 | Nakajima et al. | |
| 2019/0103299 A1 | 4/2019 | Yasuda et al. | |
| 2019/0194453 A1 | 6/2019 | Liu et al. | |
| 2023/0026069 A1 * | 1/2023 | Ueno | C09J 7/38 |

FOREIGN PATENT DOCUMENTS

| | | |
|---|---|---|
| CN | 1703773 A | 11/2005 |
| CN | 104718605 A | 6/2015 |
| JP | 2004-064040 A | 2/2004 |
| JP | 2004-210879 A | 7/2004 |
| JP | 2005-023205 A | 1/2005 |
| JP | 2006-328104 A | 12/2006 |
| JP | 2009-524705 A | 7/2009 |
| JP | 2010-270316 A | 12/2010 |
| JP | 2014-101495 A | 6/2014 |
| JP | 5890177 B2 | 3/2016 |
| JP | 6139862 B2 | 5/2017 |
| JP | 2017-226785 A | 12/2017 |
| JP | 2018-048274 A | 3/2018 |
| JP | 2019-067980 A | 4/2019 |
| JP | 2021-155690 A | 10/2021 |

(Continued)

OTHER PUBLICATIONS

TW 20216769A machine translation (Year: 2021).*
Nov. 17, 2022 International Preliminary Report on Patentability issued in International Patent Application No. PCT/JP2021/018671.
Jul. 13, 2021 International Search Report issued in International Patent Application No. PCT/JP2021/018671.
Dec. 7, 2021 Extended Search Report issued in European Patent Application No. 19885090.1.
May 18, 2021 International Preliminary Report on Patentability issued in International Patent Application No. PCT/JP2019/044773.
U.S. Appl. No. 17/293,879, filed May 13, 2021 in the name of Tometomo Uchida et al.
Jun. 22, 2023 Office Action issued in Chinese Patent Application No. 202180032669.7.

(Continued)

*Primary Examiner* — Barbara J Musser
(74) *Attorney, Agent, or Firm* — Oliff PLC

(57) ABSTRACT

A composition for temporary bonding, includes: (A) a (meth)acrylate having the following (A-1) and (A-2): (A-1) a monofunctional (meth)acrylate whose side chain is an alkyl group having 18 or more carbon atoms and homopolymer has a Tg of −100° C. to 60° C., and (A-2) a polyfunctional (meth)acrylate; (B) a polyisobutene homopolymer and/or a polyisobutene copolymer; and (C) a photo radical polymerization initiator.

1 Claim, No Drawings

(56) References Cited

FOREIGN PATENT DOCUMENTS

| KR | 20170100543 A | 9/2017 |
| KR | 20190124318 A | 11/2019 |
| KR | 20210091172 A | 7/2021 |
| WO | 2009/096459 A1 | 8/2009 |
| WO | 2011/158654 A1 | 12/2011 |
| WO | 2016/039277 A1 | 3/2016 |
| WO | 2018/174085 A1 | 9/2018 |
| WO | 2020/080309 A1 | 4/2020 |
| WO | 2020/101000 A1 | 5/2020 |

OTHER PUBLICATIONS

Feb. 10, 2020 International Search Report issued in International Patent Application No. PCT/JP2019/044773.
Jan. 31, 2024 Office Action issued in Chinese Patent Application No. 202180032669.7.
Jun. 17, 2024 Office Action issued in U.S. Appl. No. 17/293,879.
Apr. 1, 2025 Office Action issued in Japanese Patent Application No. 2024-072979.
Apr. 10, 2025 Decision on Registration issued in Korean Patent Application No. 10-2022-7039036.
Scientific Polymer Products (Poly(lauryl acrylate) data sheet; no date).
Aronix Data Sheet (Toagosei Co., Ltd.; no date).
Machine English Translation of Nishiura et al.; JP 2004-210879 (Year: 2004).
Dec. 7, 2023 Office Action Issued in U.S. Appl. No. 17/293,879.

* cited by examiner

COMPOSITION

CROSS-REFERENCE TO RELATED APPLICATIONS

This is a U.S. National Phase Application of PCT/JP2021/018671 filed on May 17, 2021, which designates the United States and claims priority to Japanese Patent Application Nos. 2020-198857 and 2020-089229, filed on Nov. 30, 2020, and May 21, 2020, respectively, the entire contents of which are incorporated herein by reference.

TECHNICAL FIELD

The present invention relates to a composition for temporary bonding.

BACKGROUND ART

Electronic devices are mainly composed of a substrate made of an inorganic material such as silicon, and are produced by forming an insulating film and a circuit on the surface and applying processing such as thinning by grinding. In processing, when a wafer substrate is used, a substrate having a thickness of about a few hundred microns is frequently used. Since most of the materials of the substrate is fragile and easily broken, measures to prevent breaking need to be taken particularly for thinning by grinding. A method has been taken as such measures, in which a protective tape for temporary bonding, which can be released after the completion of the step of processing, is applied to the side opposite to the side to be ground (also referred to as a rear side or back side). An organic resin film is used for the substrate of the tape, and although the tape is flexible, their strength and heat resistance are insufficient, and thus the tape is not suitable for use in steps at high temperature.

Then, systems have been proposed, which provides durability sufficient for conditions in the process for back-grinding and for forming an electrode on the back side by bonding the substrate of an electronic device to a support such as silicon or glass by an adhesive. What is important in the system is the adhesive layer for bonding the substrate and the support. The adhesive layer needs to be capable of bonding the substrate and the support without any gap, and have durability sufficient for withstanding the subsequent steps, and needs to enable the thinned wafer to be easily released from the support in the final step.

Properties required for adhesives include the following: (1) viscosity suitable for application and being Newtonian fluid (or shear rate independence of shear viscosity); (2) shear adhesive force withstanding grinding and polishing when thinning a substrate; (3) adequate hardness to avoid breaking of a substrate due to local conversion of the load of the grindstone applied to the substrate in grinding and polishing when thinning the substrate while dispersing the load in the in-plane direction to prevent local sagging of the substrate to maintain flatness; (4) heat resistance withstanding formation of insulating film and the step of soldering reflow; (5) chemical resistance withstanding thinning and resist steps; (6) easy release which enables the substrate to be easily released from the support; (7) properties of aggregation which leave no residue of the adhesive on the substrate after release; and (8) easiness of washing.

As an adhesive and a method for release thereof, proposed are a technique in which an adhesive containing a light-absorbing substance is irradiated with light at high intensity to decompose the adhesive layer so that the adhesive layer is released from the support (Patent Literature 1); and a technique in which a heat-melting hydrocarbon compound is used as an adhesive to perform bonding and release in the molten state by heating (Patent Literature 2). The problem with the former technique is that it requires an expensive apparatus such as a laser and the time for processing per substrate is long. The latter technique is convenient because the process is controlled only by heating, but since heat stability of the adhesive is insufficient at a temperature as high as more than 200° C., it can only be applied to a limited range.

A method for disassembling a bonded body is proposed, including a step for irradiating, with excimer light with a central wavelength of 172 nm or 193 nm, the bonded body formed by laminating substrates using an adhesive composition containing one or two or more (meth) acrylates having one or more acryloyl groups and curing the adhesive composition, in which at least one of the substrates transmits the excimer light (Patent Literature 3). However, Patent Literature 3 does not disclose use of light with longer wavelength.

A technique of an adhesive composition for encapsulating an electronic device, which contains, as a resin composition, a polyisobutene resin and a polyfunctional (meth)acrylate and does not contain a tackifier, is disclosed (Patent Literature 4). The literature also discloses use of monofunctional (meth)acrylate as a monomer, but since the glass transition temperature of the monofunctional (meth)acrylate is not disclosed, the problem is that how to exhibit flexibility, which is required when using the resin composition as an agent for temporary bonding in the process for manufacturing an electronic device, is not clear.

A technique of an adhesive composition for encapsulating an electronic device such as an organic electroluminescent device, which contains, as a resin composition, a monofunctional (meth)acrylate, a polyfunctional (meth)acrylate and a polyisobutene polymer, is also disclosed (Patent Literature 5). However, since the glass transition temperature of the monofunctional (meth)acrylate is not disclosed, the problem is that how to exhibit flexibility, which is required when using the resin composition as an agent for temporary bonding in the process for manufacturing an electronic device, is not clear.

A resin composition for bonding substrates of a different material, which contains a monofunctional (meth)acrylate, a polyfunctional (meth)acrylate and an isobutene/maleic anhydride copolymer, and a method for bonding and disassembling the same are disclosed (Patent Literature 6). However, the polymer of Patent Literature 6 is limited in the kind by containing a component derived from maleic anhydride, and the literature does not disclose details of the method of adhesion. Patent Literature 6 does not describe their suitability for spin coating, such as viscosity.

A technique of a composite resin composition curable by active energy beams, which comprises a urethane (meth) acrylate resin having an olefin polymer structure and polyisobutylene resin is disclosed (Patent Literature 7). A photocurable composition comprising a component (A): a (meth)acrylate compound having a polyisobutylene structure and a component (B): a (meth)acrylamide compound, wherein 0.1 to 15 parts by mass of the component (B) based on 100 parts by mass of the component (A) is contained (Patent Literature 8). However, Patent Literatures 7 and 8 do not disclose temporary bonding application.

CITATION LIST

Patent Literature

Patent Literature 1: Japanese Patent Laid-Open No. 2004-064040
Patent Literature 2: Japanese Patent Laid-Open No. 2006-328104
Patent Literature 3: International Publication No. WO 2011/158654
Patent Literature 4: Japanese Patent No. 5890177
Patent Literature 5: Japanese Translation of PCT International Application Publication No. 2009-524705
Patent Literature 6: Japanese Patent No. 6139862
Patent Literature 7: Japanese Patent Laid-Open No. 2017-226785
Patent Literature 8: International Publication No. WO 2020/080309

SUMMARY OF INVENTION

Technical Problem

Thus, an unsolved problem is that the conventional compositions are insufficient in curing rate, suitability for spin coating processes, heat resistant, low outgas properties under high temperature vacuum and release rate, and similarly insufficient particularly in suitability for UV laser release processes, when used for temporary bonding.

Solution to Problem

That is, the present invention may provide the following aspects:
Aspect 1. A composition for temporary bonding, comprising:
  (A) a (meth)acrylate comprising the following (A-1) and (A-2):
    (A-1) a monofunctional (meth)acrylate whose side chain is an alkyl group having 18 or more carbon atoms and homopolymer has a Tg of $-100°$ C. to $60°$ C., and
    (A-2) a polyfunctional (meth)acrylate;
  (B) a polyisobutene homopolymer and/or a polyisobutene copolymer; and
  (C) a photo radical polymerization initiator.
Aspect 2. The composition for temporary bonding according to aspect 1, further comprising:
  (D) an UV absorber.
Aspect 3. The composition for temporary bonding according to aspect 1 or 2, wherein the monofunctional (meth)acrylate (A-1) has a molecular weight of 550 or less.
Aspect 4. The composition for temporary bonding according to any of aspects 1 to 3, wherein the component (A-1) is a monofunctional (meth)acrylate having a linear structure or a branched structure alkyl group in the side chain.
Aspect 5. The composition for temporary bonding according to any of aspects 1 to 4, wherein the component (A-1) is one or more selected from the group consisting of stearyl (meth)acrylate, isostearyl (meth)acrylate, behenyl (meth)acrylate, 2-decyl-1-tetradecanyl (meth)acrylate, 2-dodecyl-1-hexadecanyl (meth)acrylate and 2-tetradecyl-1-octadecanyl (meth)acrylate.
Aspect 6. The composition for temporary bonding according to any of aspects 1 to 5, wherein the polyfunctional (meth)acrylate (A-2) has a molecular weight of 900 or less.
Aspect 7. The composition for temporary bonding according to any of aspects 1 to 6, wherein the component (A-2) is a polyfunctional (meth)acrylate having an alicyclic structure.
Aspect 8. The composition for temporary bonding according to any of aspects 1 to 7, wherein the component (A-2) is one or more selected from the group consisting of tricyclodecanedimethanol di(meth)acrylate and 1,3-di(meth)acryloyloxyadamantane.
Aspect 9. The composition for temporary bonding according to any of aspects 1 to 8, wherein the component (B) is a polyisobutene homopolymer and/or a polyisobutene copolymer having a weight average molecular weight of 1,000 or more and 5,000,000 or less, and a molecular weight distribution of 1.1 or more and 5.0 or less.
Aspect 10. The composition for temporary bonding according to any of aspects 1 to 9, wherein the component (C) is a photo radical polymerization initiator that generates radical with light having a wavelength of 350 nm or more.
Aspect 11. The composition for temporary bonding according to any of aspects 1 to 10, wherein the component (C) is one or more selected from the group consisting of bis(2,4,6-trimethylbenzoyl)phenylphosphine oxide, 2,4,6-trimethylbenzoyl diphenylphosphine oxide, bis($\eta^5$-2,4-cyclopentadien-1-yl)-bis(2,6-difluoro-3-(1H-pyrrol-1-yl)-phenyl) titanium, 2-benzyl-2-dimethylamino-1-(4-morpholinophenyl)-butan-1-on, 2-dimethylamino-2-(4-methylbenzyl)-1-(4-morpholin-4-ylphenyl)-butan-1-on, 1-[4-(phenylthio)phenyl]-1,2-octanedione 2-O-benzoyloxym, and 1-[9-ethyl-6-(2-methylbenzoyl)-9H-carbazol-3-yl]ethanone 1-(O-acetyloxime).
Aspect 12. The composition for temporary bonding according to any of aspects 1 to 11, comprising 0.01 to 5 parts by mass of the component (C) based on 100 parts by mass of the total amount of the components (A) and (B).
Aspect 13. An adhesive for temporary bonding, comprising the composition according to any of aspects 1 to 12.
Aspect 14. A cured body obtained by curing the composition according to any of aspects 1 to 12.
Aspect 15. The cured body according to aspect 14, wherein the temperature at which the mass reduction ratio by heating reaches 2% by mass is $250°$ C. or more.
Aspect 16. A bonded body obtained by adhering a substrate using the adhesive for temporary bonding according to aspect 13.
Aspect 17. A bonded body obtained by adhering a substrate using an adhesive for temporary bonding, the adhesive comprising:
  (A) a (meth)acrylate comprising the following (A-1) and (A-2):
    (A-1) a monofunctional (meth)acrylate whose side chain is an alkyl group having 18 or more carbon atoms and homopolymer has a Tg of $-100°$ C. to $60°$ C., and
    (A-2) a polyfunctional (meth)acrylate;
  (B) a polyisobutene homopolymer and/or a polyisobutene copolymer; and
  (C) a photo radical polymerization initiator,
  wherein the adhesive for temporary bonding is cured with light having a wavelength of 385 nm to 700 nm, and the substrate is released by laser light having a wavelength of less than 385 nm.
Aspect 18. A method for producing a thin wafer, comprising using the adhesive for temporary bonding according to aspect 13.
Aspect 19. A method for producing a semiconductor wafer, the method comprising the steps of:

applying an adhesive for temporary bonding to a semiconductor wafer substrate and/or a support member to bond the semiconductor wafer substrate and the support member;

curing the adhesive for temporary bonding by irradiating light having a wavelength of 350 nm to 700 nm to obtain a bonded body; and irradiating the bonded body with laser light having a wavelength of less than 385 nm to release the semiconductor wafer substrate.

Aspect 20. The production method according to aspect 18 or 19, wherein the cured adhesive for temporary bonding constitutes a single layer in the bonded body.

Aspect 21. The adhesive for temporary bonding according to aspect 13 whose application is one or more selected from the group consisting of mechanical release, IR laser release and UV laser release.

Aspect 22. A single layer cured body comprising the composition according to any of aspects 1 to 12.

Aspect 23. A cured body, comprising:
  a first cured layer containing component (A-1), component (A-2), component (B) and component (C) and not having component (D); and
  a second cured layer comprising the composition according to aspect 2,
wherein a component concentration distribution varies in the thickness direction.

Aspect 24. A cured body, comprising:
  a first cured layer obtained by curing the composition according to aspect 1 comprising component (A-1), a component (A-2), component (B) and component (C); and
  a second cured layer obtained by applying an UV absorber on the first cured layer,
wherein a component concentration distribution varies in the thickness direction.

Aspect 25. A cured body, comprising:
  a first cured layer obtained by curing the composition according to aspect 1 comprising component (A-1), component (A-2), component (B) and component (C); and
  a light heat converting (LTHC) cured layer.

Aspect 26. The cured body according to any of aspects 22 to 25 satisfying all the following conditions:
  in a light transmittance of the cured body having a thickness of 50 μm, a light transmittance in a wavelength region of 395 nm or more among the wavelengths of a light source used for curing is 70% or more;
  in a light transmittance of the cured body having a thickness of 50 μm, a light transmittance in a wavelength region of 385 nm or more and less than 395 nm among the wavelengths of a light source used for curing is 20% or more; and
  in a light transmittance of the cured body having a thickness of 50 μm, a light transmittance at a wavelength (355 nm) of UV laser used for UV laser release is 1% or less.

Aspect 27. A structure, comprising:
  the cured body according to any of aspects 22 to 26; and
  an adherend.

Aspect 28. A method for producing a structure, the method comprising the steps of:
  applying, on a wafer, a composition for temporary bonding comprising component (A-1), component (A-2), component (B) and component (C), and not having component (D) to cure partially the composition;

applying the composition according to aspect 2 on the partially cured composition; and further putting a transparent substrate on the applied composition for temporary bonding to photo-cure.

Aspect 29. A method for producing a structure, the method comprising the steps of:
  applying, on a wafer, a composition for temporary bonding comprising component (A-1), component (A-2), component (B) and component (C), and not having a component (D) to cure partially as needed;
  applying the composition according to aspect 2 on a transparent substrate to cure partially as needed; and
  firmly attaching faces of the wafer and the transparent substrate on which the composition for temporary bonding has been applied and then bonding by photo-curing.

Aspect 30. A method for producing a structure, the method comprising the steps of:
  applying, on a wafer, the composition according to aspect 1 comprising component (A-1), component (A-2), component (B) and component (C), and not having component (D) to cure partially as needed,
  applying a light heat converting (LTHC) layer on a transparent substrate and drying to cure, and
  firmly attaching the face of the wafer on which the composition for temporary bonding has been applied and the face of the transparent substrate on which the LTHC layer has been applied and then bonding by photo-curing.

Advantageous Effects of Invention

The present invention may provide a composition having, for example, excellent curing rate, suitability for spin coating processes, heat resistant, low outgas properties under high temperature vacuum and release rate, and a composition for temporary bonding, which is suitable for mechanical release process and/or various laser release processes (e.g., UV laser release process). The present invention eliminates the need to use excimer light having high energy for release.

DESCRIPTION OF EMBODIMENTS

The present invention will be described below. In the present description, the numerical range includes the upper limit and the lower limit unless otherwise specified.

The monofunctional (meth)acrylate refers to a compound having one (meth)acryloyl group per a molecule. The polyfunctional (meth)acrylate means a compound having two or more (meth)acryloyl groups per a molecule. The n-functional (meth)acrylate means a compound having n number of (meth)acryloyl groups per a molecule.

Embodiments of the present invention may provide, first of all, a composition for temporary bonding used for temporary bonding (hereinafter may be referred to as a composition), comprising the following (A) to (C).

(A) A (meth)acrylate comprising the following (A-1) and (A-2):
  (A-1) a monofunctional (meth)acrylate whose side chain is an alkyl group having 18 or more carbon atoms and homopolymer has a Tg of −100° C. to 60° C., and
  (A-2) a polyfunctional (meth)acrylate;
(B) a polyisobutene homopolymer and/or a polyisobutene copolymer; and
(C) a photo radical polymerization initiator.

Secondary, an embodiment may also provide the composition for temporary bonding further comprising the following (D);

(D) an UV absorber.

Thirdly, an embodiment may also provide a multilayer (multiple layers) structure comprising a layer having (A) to (C) and a layer having one or more of (A) to (D).

The monofunctional (meth)acrylate (A-1) whose side chain is an alkyl group having 18 or more carbon atoms and homopolymer has a Tg of −100° C. to 60° C. refers to a monofunctional (meth)acrylate whose homopolymer prepared by single polymerization has a glass transition temperature (hereinafter may be abbreviated as Tg) of −100° C. to 60° C., and a side chain of the homopolymer is an alkyl group (a functional group of a linear structure or cyclic structure aliphatic hydrocarbon). A monofunctional (meth)acrylate whose homopolymer has a Tg of −50° C. to 0° C. is more preferred.

Examples of monofunctional (meth)acrylates whose side chain is an alkyl group having 18 or more carbon atoms and homopolymer has a Tg of −100 to 60° C. include stearyl (meth)acrylate (Tg of homopolymer of acrylate: 30° C., Tg of homopolymer of methacrylate: 38° C.), isostearyl (meth)acrylate (Tg of homopolymer of acrylate: −18° C., Tg of homopolymer of methacrylate: 30° C.), behenyl (meth)acrylate (Tg of homopolymer of acrylate: 50° C., Tg of homopolymer of methacrylate: 47° C.), 2-decyl-1-tetradecanyl (meth)acrylate (Tg of homopolymer of acrylate: −36° C., Tg of homopolymer of methacrylate:−29° C.), 2-dodecyl-1-hexadecanyl (meth)acrylate (Tg of homopolymer of acrylate: −23° C., Tg of homopolymer of methacrylate: −14° C.), and 2-tetradecyl-1-octadecanyl (meth)acrylate (Tg of homopolymer of acrylate: −8° C., Tg of homopolymer of methacrylate: 1° C.). One or more of these (meth)acrylates may be used.

The glass transition means a change of a substance, in which the viscosity of the substance which is liquid at high temperature, such as glass, is rapidly increased in a certain temperature range due to decrease in temperature and the substance becomes little flowable and becomes amorphous solid. The method for measuring glass transition temperature is not particularly limited, and the glass transition temperature is usually those calculated by, for example, differential scanning calorimetry, differential thermal analysis or dynamic viscoelasticity measurement. Of them, dynamic viscoelasticity measurement is preferred. The glass transition temperature of the homopolymer of (meth)acrylate is described in, for example, J. Brandrup, E. H. Immergut, Polymer Handbook, 2nd Ed., J. Wiley, New York 1975 and Data Book of Photocuring Technology (TECHNO-NET BOOKS).

The component (A-1) may preferably be a monofunctional (meth)acrylate having a molecular weight of 550 or less.

The component (A-1) may preferably be a monofunctional alkyl (meth)acrylate having an alkyl group.

The alkyl group may preferably be one or more selected from a linear alkyl group, a branched alkyl group and a cyclic alkyl group. One or more selected from a linear alkyl group and a branched alkyl group are more preferred. The component (A-1) preferably has a long chain branched alkyl group or a cycloalkyl group, for example, a branched alkyl group or a cycloalkyl group such as an isostearyl group, an isotetracosanyl group (e.g., a 2-decyl-1-tetradecanyl group) and isotriacontanyl group (e.g., 2-tetradecyl-1-octadecanyl group) having 18 to 40 carbon atoms, more preferably 18 to 32 carbon atoms, from the viewpoint of improvement of compatibility with the component (B) (in particular, improvement of compatibility with the component (B) having high molecular weight). Using such a long chain, high molecular weight and highly aliphatic hydrocarbon component (more preferably increasing aliphatic hydrocarbon properties of the whole system) improves involatility, chemical resistance and heat resistance required for the composition for temporary bonding.

Examples of (A-1) is preferably one or more selected from the group consisting of stearyl (meth)acrylate, isostearyl (meth)acrylate, behenyl (meth)acrylate, 2-decyl-1-tetradecanyl (meth)acrylate, 2-dodecyl-1-hexadecanyl (meth)acrylate and 2-tetradecyl-1-octadecanyl (meth)acrylate.

The monofunctional alkyl (meth)acrylate having an alkyl group (A-1) is preferably a (meth)acrylate of the following formula 1.

[Formula 1]

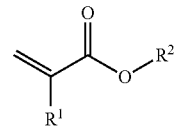

(formula 1)

$R^1$ is a hydrogen atom or a methyl group. $R^2$ is an alkyl group.

$R^1$ may preferably be a hydrogen atom.

$R^2$ may preferably have 18 to 32 carbon atoms. One or more of these (meth)acrylates may be used.

Preferred examples of monofunctional alkyl (meth)acrylate in which $R^2$ has an alkyl group having 18 to 32 carbon atoms may include (meth)acrylate having a linear or branched alkyl group, such as stearyl (meth)acrylate, isostearyl (meth)acrylate, nonadecyl (meth)acrylate, eicodecyl (meth)acrylate, behenyl (meth)acrylate, 2-decyl-1-tetradecanyl (meth)acrylate and 2-tetradecyl-1-octadecanyl (meth)acrylate.

The amount of the monofunctional (meth)acrylate (A-1) used may preferably be 35 parts by mass or more, more preferably 40 parts by mass or more, and further preferably 45 parts by mass or more based on 100 parts by mass of the total amount of the components (A) and (B). The amount of the monofunctional (meth)acrylate (A-1) used may preferably be 54 to 90 parts by mass, more preferably 54 to 80 parts by mass, and further preferably 54 to 75 parts by mass based on 100 parts by mass of the total amount of the components (A) and (B). When the amount is 54 parts by mass or more, the resin composition after mixing is unlikely to be phase-separated and flexibility at room temperature is obtained. When the amount is 90 parts by mass or less, viscosity required for application, heat resistance and curability are obtained. The amount of monofunctional (meth)acrylate used in the conventional composition disclosed in Patent Literature 7 is less than 53 parts by mass, and thus flexibility required for the composition for temporary bonding for manufacturing an electronic device is unlikely to be obtained.

The polyfunctional (meth)acrylate (A-2) refers to a compound having two or more (meth)acryloyl groups in a molecule. The polyfunctional (meth)acrylate may have an acryloyl group alone or a methacryloyl group alone, or both of the acryloyl group and the methacryloyl group as the polymerizable functional group.

The polyfunctional (meth)acrylate (A-2) may have a molecular weight of preferably 900 or less, more preferably 700 or less, most preferably 500 or less, and particularly preferably 400 or less.

Examples of polyfunctional (meth)acrylates (A-2) include bifunctional (meth)acrylate, trifunctional (meth)acrylate and tetra- or more functional (meth)acrylate.

Examples of bifunctional (meth)acrylates include 1,3-di(meth)acryloyloxyadamantane, tricyclodecane dimethanol di(meth)acrylate, 1,3-butanediol di(meth)acrylate, 1,4-butanediol di(meth)acrylate, 1,6-hexadiol di(meth)acrylate, 1,9-nonanediol di(meth)acrylate, 1,10-decanediol di(meth)acrylate, neopentyl glycol di(meth)acrylate, dicyclopentanyl di(meth)acrylate, neopentyl glycol-modified trimethylolpropane di(meth)acrylate, stearic acid-modified pentaerythritol di(meth)acrylate, tripropylene glycol di(meth)acrylate, 2,2-bis(4-(meth)acryloxydiethoxyphenyl)propane, 2,2-bis(4-(meth)acryloxypropoxyphenyl)propane, 2,2-bis(4-(meth)acryloxytetraethoxyphenyl)propane, isocyanuric acid ethylene oxide-modified di(meth)acrylate and 9,9-bis[4-(2-hydroxyethoxy]phenyl]fluorene di(meth)acrylate.

Examples of trifunctional (meth)acrylates include isocyanuric acid ethylene oxide-modified tri(meth)acrylate, pentaerythritol tri(meth)acrylate, trimethylolpropane tri(meth)acrylate and tris[(meth)acryloyloxyethyl] isocyanurate.

Examples of tetra- or more functional (meth)acrylates include ditrimethylolpropane tetra(meth)acrylate, dimethylolpropane tetra(meth)acrylate, pentaerythritol tetra(meth)acrylate, pentaerythritolethoxy tetra(meth)acrylate, dipentaerythritol penta(meth)acrylate and dipentaerythritol hexa(meth)acrylate.

Of the component (A-2), polyfunctional (meth)acrylate having an alicyclic structure is preferred, and polyfunctional (meth)acrylate having an alicyclic structure having 5 or more carbon atoms is more preferred. The polyfunctional (meth)acrylate having an alicyclic structure having 5 or more carbon atoms is preferably one or more selected from tricyclodecanedimethanol di(meth)acrylate and 1,3-di(meth)acryloyloxyadamantane.

The amount of the polyfunctional (meth) acrylate (A-2) used may preferably be 1 to 40 parts by mass, more preferably 20 to 30 parts by mass based on 100 parts by mass of the total amount of the components (A) and (B). When the amount is 1 part by mass or more, good curability, heat resistance and release properties are obtained. When the amount is 40 parts by mass or less, the composition after mixing is unlikely to be phase-separated or heat resistance may not be reduced.

The polyisobutene homopolymer among the selections for the component (B) refers to a homopolymer obtained by polymerization using isobutene as a raw material monomer. The homopolymer is available, for example, as Oppanol from BASF. The polyisobutene copolymer among the selections for the component (B) refers to a copolymer (or heteropolymer) obtained by polymerization using isobutene as a raw material monomer. The copolymer may be a random copolymer or a block copolymer, with a block copolymer being particularly preferably used. The block copolymer is available, for example, as SIBSTAR containing a polyisobutene block chain and a polystyrene block chain from Kaneka Corporation. These isobutene polymers may have a (meth)acrylate group(s) on one or both terminals. Examples of such a polymer include an isobutene polymer containing acrylate groups on both terminals such as the EPION series, EP400V, available from Kaneka Corporation.

These isobutene polymers may have a polymerizable functional group(s) on one or both terminals other than the (meth)acrylate group. For example, "NOF Polybutene (trademark)", which is an isobutene polymer having an ethylenically unsaturated group, is available from NOF CORPORATION.

It is preferable that the component (B) be of what is called high molecular weight grade from the viewpoint of provision of appropriate viscosity when mixed with the component (A). The component (B) may have a weight average molecular weight of 1,000 or more and 5,000,000 or less, and further preferably 80,000 or more and 5,000,000 or less. Furthermore, the component (B) may have a molecular weight distribution of preferably 1.1 or more and 5.0 or less, and more preferably 2.2 or more and 2.9 or less. In particular, the weight average molecular weight may be preferably 80,000 or more and 5,000,000 or less and the molecular weight distribution is 2.2 or more and 2.9 or less. One or more of these polyisobutene homopolymers and/or polyisobutene copolymers may be used for the component (B).

In a preferable embodiment, the composition may comprise the polyisobutene copolymer as the component (B). The polyisobutene copolymer comprises an isobutene monomer unit and a monomer unit other than the isobutene monomer unit, and such a copolymerization form is a concept of encompassing a block copolymer and a random copolymer, and an alternating copolymer. A block copolymer is preferably used. The reason therefor is as follows. In comparison with a block copolymer and a random copolymer, generally, in the random copolymer, average values of various properties such as glass transition temperature of homopolymers respectively of more than one monomer, which are structural components thereof, are obtained, whereas various properties such as glass transition temperature of homopolymers of respective monomers in the block copolymer are not averaged but maintained as they are and both are exhibited simultaneously. Particularly, in a triblock copolymer, it is known that physical properties of the blocks on both terminals are more intensely exhibited than the middle block. For example, in the case of a triblock copolymer having a structure wherein both terminals of a polyisobutene block chain having a glass transition temperature of about −60° C. are sandwiched by polystyrene block chains having such a temperature of about 100° C., the polystyrene block chains on both terminals have a high glass transition temperature thereby showing a higher thickening effect than a polyisobutene homopolymer having the same molecular weight. Due to this comparatively high thickening effect, a copolymer used may have a lower molecular weight than a polyisobutene homopolymer, but when a polymer having a low molecular weight is used, the polymer hardly separates and precipitates when stored at a low temperature of about 5° C., hence beneficial. In addition, the inclusion of polystyrene, which is an aromatic hydrocarbon having higher polarity than polyisobutene, which is an aliphatic hydrocarbon, in the component provides more increased compatibility with the component (A-2) having high polarity due to more than one (meth)acrylic groups than with the (meth)acrylate monomer having an aliphatic hydrocarbon side chain, which is the component (A-1), hence beneficial.

The weight average molecular weight in the present description is measured by gel permeation chromatography (GPC) in terms of standard polystyrene. More specifically, the average molecular weight is determined by preparing a calibration curve using tetrahydrofuran as a solvent and using a GPC system (SC-8010 manufactured by Tosoh Corporation) with a commercially available standard polystyrene under the following conditions.

Flow rate: 1.0 ml/min
Set temperature: 40° C.
Configuration of columns: a total of 3 columns of 1 column of "TSK guard column MP (xL)" 6.0 mmID× 4.0 cm made by Tosoh Corporation and 2 columns of "TSK-GEL MULTIPORE HXL-M" 7.8 mm ID×30.0 cm (theoretical plate number: 16,000 plates; the total theoretical plate number: 32,000 plates)
Amount of sample injected: 100 μl (concentration of sample solution 1 mg/ml)
Pressure of feeding liquid: 39 kg/cm$^2$
Detector: RI detector (Differential index detector)

The amount of the component (B) used may preferably be 30 parts by mass or less, and more preferably 25 parts by mass or less based on 100 parts by mass of the total amount of the components (A) and (B). The amount of the component (B) used may preferably be 1 to 20 parts by mass, and more preferably 5 to 20 parts by mass based on 100 parts by mass of the total amount of the components (A) and (B). When the amount of the component (B) is 1 part by mass or more, viscosity necessary for application may be provided, whereas the amount is 20 parts by mass or less, the composition after mixing is unlikely to be phase-separated and good curability and heat resistance may be obtained. Use of the component (B) of what is called high molecular weight grade described above provides not only an effect that easily achieves the desired viscosity even if the amount added is small, but also an effect that achieves suitability for spin coating and suitability for bar coating; in other words, the target process can be selected for the suitability.

The photo radical polymerization initiator (C) is, for example, a compound whose molecules are disconnected and divided into two or more radicals by irradiation of ultraviolet light or visible light (e.g., a wavelength of 350 nm to 700 nm, preferably 385 nm to 700 nm or 365 nm to 500 nm, and more preferably 385 nm to 450 nm).

The photo radical polymerization initiator (C) may preferably be one or more selected from an acylphosphine oxide compound, a titanocene compound, or an α-aminoalkylphenone compound from the viewpoints of reaction speed, heat resistance after curing, low outgas properties and absorption properties in a region different from a wavelength of an UV laser wavelength used for the UV laser release to be described later and an absorption wavelength region of an UV absorber used for the UV laser release. An oxime ester compound, other than the above, may be selected as the photo radical polymerization initiator for a resin composition for the temporary bonding application used to prevent breakage from bonding to heating steps for a support substrate of a substrate to be processed, which is not a layer for the UV laser release, in the composition for temporary bonding having the structure to be described later.

Examples of acylphosphine oxide compounds include bis(2,4,6-trimethylbenzoyl)phenylphosphine oxide and 2,4,6-trimethylbenzoyldiphenylphosphine oxide. Among them, bis(2,4,6-trimethylbenzoyl)phenylphosphine oxide is particularly preferred.

Examples of titanocene compounds include bis(η$^5$-2,4-cyclopentadien-1-yl)-bis(2,6-difluoro-3-(1H-pyrrol-1-yl)-phenyl)titanium.

Examples of α-aminoalkylphenone compounds include 2-benzyl-2-dimethylamino-1-(4-morpholinophenyl)-butan-1-on, and 2-dimethylamino-2-(4-methylbenzyl)-1-(4-morpholin-4-ylphenyl)-butan-1-on.

Examples of oxime ester compounds include 1-[4-(phenylthio)phenyl]-1,2-octanedione 2-O-benzoyloxym, 1-[9-ethyl-6-(2-methylbenzoyl)-9H-carbazol-3-yl]etanone 1-(O-acetyloxime). Among them, 1-[9-ethyl-6-(2-methylbenzoyl)-9H-carbazol-3-yl]etanone 1-(O-acetyloxime) is preferred.

The photo radical polymerization initiator (C) is preferably one or more selected from the group consisting of bis(2,4,6-trimethylbenzoyl)phenylphosphine oxide, 2,4,6-trimethylbenzoyl diphenylphosphine oxide, bis (η$^5$-2,4-cyclopentadien-1-yl)-bis(2,6-difluoro-3-(1H-pyrrol-1-yl)-phenyl)titanium, 2-benzyl-2-dimethylamino-1-(4-morpholinophenyl)-butan-1-on, 2-dimethylamino-2-(4-methylbenzyl)-1-(4-morpholin-4-ylphenyl)-butan-1-on, 1-[4-(phenylthio)phenyl]-1,2-octanedione 2-O-benzoyloxym, and 1-[9-ethyl-6-(2-methylbenzoyl)-9H-carbazol-3-yl]ethanone 1-(O-acetyloxime).

When the composition for temporary bonding for the UV laser release step of the present invention is provided, the most preferable photo radical polymerization initiator is an acylphosphine oxide compound. Preferable acylphosphine oxide compound includes bis(2,4,6-trimethylbenzoyl)phenylphosphine oxide and/or 2,4,6-trimethylbenzoyl diphenylphosphine oxide. These photo radical polymerization initiators, in addition to excellent depth curability due to high sensitivity and photobleaching properties, have an absorption wavelength region for generating radical extending to a comparatively long-wavelength region, specifically bis(2,4,6-trimethylbenzoyl)phenylphosphine oxide has a range to a wavelength of about 440 nm, which has a significant difference from the absorption wavelength region of the UV absorber used for the UV laser release step to be described later. In other words, the degree of the UV curing inhibition by an UV absorber added is small, thereby enabling the radical polymerization to initiate with light having a longer wavelength. For this reason, the radical polymerization is enabled to initiate and cure at a comparatively high rate and efficiently even in the presence of an UV absorber.

The most preferably, the photo radical polymerization initiator may be selected from the absorbance. Specifically, the photo radical polymerization initiator may be selected from one or more compounds satisfying any one or more conditions of, when dissolved in a concentration of 0.1% by mass in a solvent having no maximum absorption in a wavelength region from 300 nm to 500 nm (e.g., acetonitrile and toluene), having an absorbance of 0.5 or more at a wavelength of 365 nm, having an absorbance of 0.5 or more at a wavelength of 385 nm, and having an absorbance of 0.5 or more at a wavelength of 405 nm. Examples of compounds satisfying such conditions include, when dissolved in a concentration of 0.1% by mass in acetonitrile as a solvent, 1-[9-ethyl-6-(2-methylbenzoyl)-9H-carbazol-3-yl]ethanone 1-(O-acetyloxime) having an absorbance of 0.5 or more at a wavelength of 365 nm, 1-[4-(phenylthio)phenyl]-1,2-octanedione 2-O-benzoyloxym having an absorbance of 0.5 or more at wavelengths of 365 nm and 385 nm, and bis(2,4,6-trimethylbenzoyl)phenylphosphine oxide and 2,4,6-trimethylbenzoyl diphenylphosphine oxide having an absorbance of 0.5 or more at wavelengths of 365 nm, 385 nm and 405 nm.

Additionally, from the viewpoint of compatibility of curability by the photo radical polymerization initiator and UV laser release, bis(η$^5$-2,4-cyclopentadien-1-yl)-bis(2,6-difluoro-3-(1H-pyrrol-1-yl)-phenyl)titanium having an absorption wavelength region ranging from 400 to 500 nm may also be used as the photo radical polymerization initiator.

The amount of the photo radical polymerization initiator (C) used may preferably be 0.01 to 5 parts by mass, more preferably 0.1 to 1 part by mass based on 100 parts by mass of the total amount of (A) and (B) from the viewpoints of reaction speed, heat resistance after curing and low outgas properties. When the amount is 0.01 part by mass or more, sufficient curability are obtained. When the amount is 5 parts by mass or less, the heat resistance and low outgas properties are unlikely to be impaired.

The UV absorber usable as the component (D) refers to, for example, a compound whose molecules are disconnected, decomposed and vaporized by laser irradiation of ultraviolet light or visible light, and the decomposition and vaporization occurred at the interface between a support substrate (or a support) and a temporary bonding agent cause the adhesive strength between the temporary bonding agent and the support substrate (the support) to disappear that has been maintained until immediately before the release step.

The UV absorber (D) is preferably one or more selected from a benzotriazole compound and a hydroxyphenyltriazine compound from the viewpoints of the overlapping degree over an UV laser wavelength in the UV absorption wavelength region, UV absorption properties at the same wavelength, low outgas properties and heat resistance.

The benzotriazole compound is particularly preferably one or more selected from the group consisting of 2-(2H-benzotriazol-2-yl)-4,6-bis(1-methyl-1-phenylethyl)phenol, 2,2'-methylenebis[6-(2H-benzotriazol-2-yl)-4-(1,1,3,3-tetramethylbutyl)phenol], 2-(2H-benzotriazol-2-yl)-6-(1-methyl-1-phenylethyl)-4-(1,1,3,3-tetramethylbutyl)phenol and 2-[2-hydroxy-3-(3,4,5,6-tetrahydrophthalimide-methyl)-5-methylphenyl]benzotriazol from the viewpoints of compatibility with the resin component, UV absorption properties, low outgas properties and heat resistance.

The hydroxyphenyltriazine compound is particularly preferably one or more selected from the group consisting of 2-[4-[(2-hydroxy-3-(2'-ethyl)hexyl)oxy]-2-hydroxyphenyl]-4,6-bis (2,4-dimethylphenyl)-1,3,5-triazine, 2,4-bis (2-hydroxy-4-butyloxyphenyl)-6-(2,4-bis-butyloxyphenyl)-1,3,5-triazine and 2,4,6-tris(2-hydroxy-4-hexyloxy-3-methylphenyl)-1,3,5-triazine from the viewpoints of compatibility with the resin component, UV absorption properties, low outgas properties and heat resistance.

When the composition for temporary bonding for the UV laser release step of the present invention is provided, the most preferable UV absorber is one or more selected from the group consisting of 2,4,6-tris(2-hydroxy-4-hexyloxy-3-methylphenyl)-1,3,5-triazine, 2,4-bis(2-hydroxy-4-butyloxyphenyl)-6-(2,4-bis-butyloxyphenyl)-1,3,5-triazine, or 2,2'-methylenebis[6-(2H-benzotriazol-2-yl)-4-(1,1,3,3-tetramethybutyl)phenol]. These may be selected from a wide range of amounts to be used because of excellent compatibility with the resin components (A) and (B), high melting points, a comparatively low vapor pressure under a temperature condition of about 300° C. or less, and may contribute to the outgas reduction from the composition for temporary bonding after curing under the temperature condition.

The most preferable UV absorber (D) include the following absorbers selected from the UV transmittance. When the component (D) has such an UV transmittance, the effect for suitably controlling the curing and release of the composition is obtained.

When an UV absorber is dissolved in a concentration of 0.002% by mass in a solvent that does not have the maximum absorption in a wavelength of 290 to 410 nm, a transmittance is 50% or less at a wavelength of 355 nm with an optical path length of 1 cm, and a transmittance of more than 50% at a wavelength of 385 to 420 nm is preferred. Further preferably, a transmittance may be 40% or less at a wavelength of 355 nm, and a transmittance may be 60% or more at 385 to 420 nm.

Examples of the most preferable UV absorber (D) include the following.

2-(2H-Benzotriazol-2-yl)-4,6-bis(1-methyl-1-phenylethyl)phenol (Tinuvin 900 made by BASF, ADK STAB LA-24 made by ADEKA Corporation, EVERSORB 76/EVERSORB 234 made by Everlight Chemical Industrial Corp., molecular weight 447) having a transmittance of 20% or less at a wavelength of 355 nm with an optical path length of 1 cm, and a transmittance of 60% or more at a wavelength of 385 to 420 nm, when dissolved in a concentration of 0.002% by mass in toluene as a solvent.

2-(2H-Benzotriazol-2-yl)-6-(1-methyl-1-phenylethyl)-4-(1,1,3,3-tetramethylbutyl)phenol (Tinuvin 928 made by BASF, EVERSORB 89/89FD made by Everlight Chemical Industrial Corp., molecular weight 442) having a transmittance of 30% or less at a wavelength of 355 nm with an optical path length of 1cm, and a transmittance of 70% or more at a wavelength of 385 to 420 nm, when dissolved in a concentration of 0.002% by mass in toluene as solvent.

2-[4-[(2-Hydroxy-3-(2'-ethyl)hexyl)oxy]-2-hydroxyphenyl]-4,6-bis(2,4-dimethylphenyl)-1,3,5-triazine (Tinuvin 405 made by BASF, molecular weight 584) having a transmittance of 40% or less at a wavelength of 355 nm with an optical path length of 1 cm, and a transmittance of 90% or more at a wavelength of 385 to 420 nm, when dissolved in a concentration of 0.002% by mass in tetrahydrofuran as a solvent.

2,4-Bis(2-hydroxy-4-butyloxyphenyl)-6-(2,4-bis-butyloxyphenyl)-1,3,5-triazine (Tinuvin 460 made by BASF, molecular weight 630) having a transmittance of 10% or less at a wave length of 355 nm with an optical path length of 1 cm, and a transmittance of 80% or more at a wavelength of 385 to 420 nm, when dissolved in a concentration of 0.002% by mass in tetrahydrofuran as a solvent.

The UV transmittance of the cured body in the present description is the value obtained by reflectometric spectroscopy. Specifically, a transmittance is obtained in the following conditions using a film of a cured body having a thickness of about 50 μm prepared by being sandwiched between sheets of a PET resin with a reflectometric spectroscopy analyzer (V-650 made by JASCO Corporation).
Cell length: 10 mm
Measurement mode: T (Transmittance)
Measurement range: 450 to 200 nm
Data reading interval: 1 nm
UV/vis Band width: 2.0 nm
Response: medium
Scanning speed: 40 nm/min
Light source switching: 340 nm
Light source: D2/WI
Filter switching: Step
Correction: Base line The amount of the UV absorber, which is the component (D), used may preferably be 0.01 to 5 parts by mass, and more preferably 0.5 to 2.5 parts by mass, based on 100 parts by mass of the total amount of (A) to (B). When the amount is 0.01 parts by mass or more, sufficient UV laser release rate is obtained, whereas when the amount is 5 parts by mass or less, the low outgas properties and heat resistance are unlikely to be impaired.

The composition having these properties may suitably be used particularly for the ion implantation in the back side step after thinning and for processes including high temperature vacuum process such as electrode formation by annealing and spattering.

When a cured film having a thickness of 50 µm is prepared using the composition for temporary bonding of the present invention, it is preferable that one or more of the following conditions be satisfied, and it is more preferable that all be satisfied. The following conditions may be satisfied by using, for example, an UV absorber or the photo radical polymerization initiator.

- in the light transmittance of the cured film, a light transmittance in a wavelength region of 395 nm or more among the wavelengths of a light source used for curing is 70% or more;
- in the light transmittance of the cured film, a light transmittance in a wavelength region of 385 nm or more and less than 395 nm among the wavelengths of a light source used for curing is 20% or more; and
- in the light transmittance of the cured film, a light transmittance at a wavelength (355 nm) of UV laser used for UV laser release is 1% or less.

When these conditions are satisfied, the compatibility of sufficiently high curing rate and UV laser release rate for practical use is enabled. Further, in addition to the compatibility of sufficiently high curing rate and UV laser release rate, a mass reduction ratio under heating condition after curing may be reduced (or the amount of outgas under high temperature vacuum may be reduced). The temporary bonding agent having these properties may suitably be used particularly for the ion implantation in the back side step after thinning and for processes including high temperature vacuum process such as electrode formation by annealing and spattering.

An antioxidant may be used for the composition of the present invention in order to maintain releasability after being exposed to high temperature. Examples of antioxidants include methyl hydroquinone, hydroquinone, 2,2-methylene-bis(4-methyl-6-t-butylphenol), catechol, hydroquinone monomethyl ether, mono-t-butyl hydroquinone, 2,5-di-t-butyl hydroquinone, p-benzoquinone, 2,5-diphenyl-p-benzoquinone, 2,5-di-t-butyl-p-benzoquinone, picric acid, citric acid, phenothiazine, t-butyl catechol, 2-butyl-4-hydroxyanisole, 2,6-di-t-butyl-p-cresol and 4-((4,6-bis (octylthio)-1,3,5-triazin-2-yl)amino)-2,6-di-t-butylphenol.

The amount of the antioxidant used is preferably 0.001 to 3 parts by mass based on 100 parts by mass of the total amount of (A) to (D). When the amount is 0.001 part by mass or more, releasability after being exposed to high temperature is surely maintained. When the amount is 3 parts by mass or less, good adhesion is obtained and uncuring does not occur.

Known methods of application such as spin coating, screen printing and coaters may be used as the method for applying the composition. The composition of the present invention has a viscosity of preferably 100 mPa·s or more, more preferably 1,000 mPa·s or more, and most preferably 2,000 mPa·s or more from the viewpoints of coating properties and operationability at 23° C. (at atmospheric pressure). The composition of the present invention has a viscosity of preferably 10,000 mPa·s or less, more preferably 5,000 mPa·s or less, and most preferably 4,000 mPa·s or less from the viewpoints of coating properties and operationability. When the viscosity is 100 mPa·s or more, coating properties, in particular coating properties in spin coating are excellent. When the amount is 10,000 mPa·s or less, operationability is excellent.

Spin coating process refers to a method in which, for example, a liquid composition is dropped on a substrate and the substrate is rotated at a pre-determined rotational speed to coat the surface of the substrate with the composition. Spin coating enables high quality coating to be produced efficiently.

The composition of the present invention may be used as a resin composition for temporary bonding, an adhesive for temporary bonding, an adhesive sheet or an adhesive for temporary bonding for manufacturing an electronic device. In the present invention, the composition for temporary bonding, the resin composition for temporary bonding and the adhesive for temporary bonding may collectively be called the temporary bonding agent.

When a substrate to be processed and an optically transparent support substrate (or a support) are bonded using the composition of the present invention, it is preferable that the substrates be irradiated with visible light or ultraviolet light (wavelength or central wavelength 365 to 405 nm) so that the amount of energy is 1 to 20,000 mJ/cm$^2$. An amount of energy of 1 mJ/cm$^2$ or more provides sufficient adhesiveness, and an amount of energy of 20,000 mJ/cm$^2$ or less provides excellent productivity, generates few decomposition products from photo radical polymerization initiator, and suppresses generation of outgas. The amount of energy is preferably 1 to 10,000 mJ/cm$^2$ from the viewpoints of productivity, adhesiveness, low outgas properties and easy release.

Although the substrate to be bonded using the composition of the present invention is not particularly limited, it is preferable that at least one substrate be a transparent substrate which transmits light. Examples of transparent substrates include inorganic substrates such as crystal, glass, quartz, calcium fluoride and magnesium fluoride, and organic substrates such as plastic. Of them, inorganic substrates are preferred because they are versatile and provide high effects. Of the inorganic substrates, one or more selected from glass and quartz are preferred.

In an embodiment, the composition of the present invention is photo-curable, and the cured body provided by such a composition has excellent heat resistance and releasability. In an embodiment the amount of outgas from the cured body of the composition of the present invention is small even when exposed to high temperature, and thus the cured body is suitable for bonding, encapsulating and coating various optical parts, optical devices and electronic parts. The composition of the present invention is suitable for applications in which wide-ranging durability such as solvent resistance, heat resistance and adhesiveness, is required, and in particular, suitable for processes for manufacturing semiconductors.

The cured body of the composition of the present invention may be used in a process having a wide temperature range from room temperature to high temperature. The temperature of heating in a process may preferably be 350° C. or less, more preferably 300° C. or less, and most preferably 250° C. or less. In a preferable embodiment, the temperature at which the mass reduction ratio of the cured body by heating reaches 2% by mass may be 250° C. or more. The bonded body bonded using the adhesive for temporary bonding of the present invention has high shear adhesive strength and may withstand the step for thinning and the like, and may be easily released after the step for heating, such as forming an insulating film. When used at high temperature, the cured body of the composition of the present invention may be used in a process at a high temperature of, for example, preferably 200° C. or more, and more preferably 250° C. or more.

Furthermore, in an embodiment of the present invention, a bonded body to which a substrate is bonded using an adhesive is obtained, and the effect is obtained for releasing the substrate by applying an external force to the bonded body. For example, it may be released by inserting a blade, sheet or wire.

Furthermore, in an embodiment of the present invention, a bonded body to which a substrate is bonded using an adhesive is obtained, and the effect is obtained for releasing the substrate by irradiating the entire surface by scanning with UV laser or IR laser from the side of the optically transparent support of the bonded body.

Method for Producing Thin Wafer

The embodiment of the present invention may also provide a method for producing a thin wafer. The production method comprises using the composition for temporary bonding or the adhesive for temporary bonding (hereinafter may be referred to as an adhesive or a temporary bonding agent) described above as an adhesive layer between a wafer with a semiconductor circuit and the like and a support. The method for producing a thin wafer of the present invention comprises the following steps (a) to (e).

Step (a)

The step (a) is a step in which, when bonding a circuit-bearing surface of a wafer having the circuit-bearing surface on the front and a circuit-free surface on the back to a support with an adhesive, the adhesive is applied to the support or the wafer with the circuit by spin coating to bond another support or wafer with circuit in vacuum.

The wafer having a circuit-bearing surface and a circuit-free surface has the circuit-bearing surface on one side and the circuit-free surface on the other side. Generally the present invention can be applied to semiconductor wafers. Examples of semiconductor wafers include not only silicon wafer but also gallium nitride wafer, lithium tantalate wafer, lithium niobate wafer, silicon carbide wafer, germanium wafer, gallium-arsenide wafer, gallium-phosphorus wafer and gallium-arsenide-aluminum wafer. The thickness of the wafer is not particularly limited, and is preferably 600 to 800 μm, and more preferably 625 to 775 μm. A transparent substrate which transmits light may be used as a support.

Step (b)

The step (b) is for photo-curing the adhesive. It is preferable that after forming the processed wafer (laminated substrate), the wafer be irradiated with light in a region of visible light or ultraviolet light (wavelength or central wavelength is preferably 350 to 405 nm, more preferably 365 to 405 nm, and most preferably 385 to 405 nm) with the amount of energy of 1 to 20,000 mJ/cm². An amount of energy of 1 mJ/cm² or more provides sufficient adhesiveness, and an amount of energy of 20,000 mJ/cm² or less provides excellent productivity, generates few decomposition products from photo radical polymerization initiator, and suppresses generation of outgas. The amount of energy is more preferably 1,000 to 10,000 cm² from the viewpoints of productivity, adhesiveness, low outgas properties and easy release.

The composition may be cured by using black light, UV-LED and visible light-LED as a light source and, for example, the following light sources may be used. For the black light, light including a component having a wavelength of 385 nm or more is preferably used regardless of the central wavelength thereof. When a wavelength range is described in the present description, it should be decided whether or not the range is included in the range based on whether or not the central wavelength is included in the range.

Black light (central wavelength 365 nm, intensity 10 mW/cm², TUV-8271 made by TOYO ADTEC)

UV-LED (wavelength 385±5 nm, intensity 350 mW/cm² (condition: work distance from mirror unit edge 20 mm), H-4MLH200-V2-1S19 + specially designed mirror unit made by HOYA CORPORATION)

UV-LED (wavelength 395±5 nm, intensity 375 mW/cm² (condition: work distance from mirror unit edge 20 mm), H-4MLH200-V3-1S19 + specially designed mirror unit made by HOYA CORPORATION)

UV-LED (wavelength 405±5 nm, intensity 400 mW/cm² (condition: work distance from mirror unit edge 20 mm), H-4MLH200-V4-1S19 + specially designed mirror unit made by HOYA CORPORATION)

UV-LED (central wavelength 405 nm, intensity 10 mW/cm², HLDL-120V0-NWPSC made by CCS Inc.)

Visible-LED (wavelength 451±5 nm, intensity 550 mW/cm (condition: work distance from mirror unit edge 10 mm), HLDL-155VL450-PSC made by CCS Inc.)

Visible-LED (wavelength 492±5 nm, intensity 400 mW/cm² (condition: work distance from mirror unit edge 10 mm), HLDL-155BG-PSC made by CCS Inc.)

In a preferable embodiment, UV-LED or visible-LED with a low integrated light intensity (only short irradiation time is required) may be a light source rather than black light with a high integrated light intensity generally due to a broad irradiation wavelength, likely extending the irradiation time. More specifically, the use of a LED light source having a narrow irradiation wavelength band enables the temporary bonding in a short time, thereby consequently providing an effect for saving time required for the manufacturing step.

Step (c)

The step (c) is for grinding and/or polishing the circuit-free surface of the wafer bonded to the support, in other words, the step for grinding the back side of the processed wafer obtained by lamination in the step (a) to reduce the thickness of the wafer. The thinned wafer has a thickness of preferably 10 to 300 μm, and more preferably 30 to 100 μm. The method of grinding/polishing the back side of the wafer is not particularly limited and a known grinding/polishing method may be used. It is preferable that the wafer be ground while pouring water to the wafer and the grindstone (grindstone with a diamond blade and the like) to cool them.

Step (d)

The step (d) is for processing the processed wafer whose circuit-free surface has been ground/polished; in other words, processing the circuit-free surface of the processed wafer which has been thinned by grinding/polishing the back side. The step includes various processes used at the wafer level, such as formation of electrodes, formation of metal wiring and formation of protective film. More specifically, it includes conventionally known processes such as metal sputtering for forming an electrode and the like, wet etching for etching the metal-sputtering layer, formation of patterns by application of resist for preparing mask for forming metal wiring, exposure and development, removal of resist, dry etching, formation of metal plating, silicon etching for forming TSV and formation of oxide film on the surface of silicon.

Step (e)

The step (e) is a release step. In the step, the wafer processed in the step (d) is released from the processed wafer. For example, the step is for releasing the wafer from the processed wafer before dicing after doing various processing on the thinned wafer. At that stage, dicing tape may be attached in prior to the release to the side which has been thinned and processed. The release step is usually carried out in a condition of a relatively low temperature of room temperature to about 60° C. For the release step, any of a known UV laser release step, IR laser release step or mechanical release step may be employed.

The UV laser release step is a step for, for example, irradiating the entire surface of a processed wafer with UV laser so that the wafer is scanned with the laser linearly and reciprocally from the end of an optically transparent support in the direction of a tangent to decompose the adhesive layer with the energy of the laser to release the wafer. Such a release step is disclosed in, for example, Japanese Translation of PCT International Application Publication No. 2019-501790, and Japanese Translation of PCT International Application Publication No. 2016-500918. The composition for temporary bonding of the present invention comprising particularly the component (D) and satisfying preferable requirements of the component (C) and/or the component (D) is suitable particularly for the UV laser release step.

The IR laser release step is a step for, for example, irradiating the entire surface of a processed wafer with IR laser so that the wafer is scanned with the laser linearly and reciprocally from the end of an optically transparent support in the direction of a tangent to heat and decompose the adhesive layer with the energy of the laser to release the wafer. Such a release step is disclosed in, for example, Japanese Patent 4565804. To perform the IR laser release step, a light heat converting layer (e.g., "LTHC; Light-To-Heat-Conversion release coating" manufactured by 3M) which absorbs IR laser light and converts it to energy may be provided between a layer of temporary bonding agent and a glass support. When LTHC made by 3M is used, LTHC is, for example, spin-coated and cured on the glass support, and the layer of temporary bonding agent, which is spin-coated on wafer, is laminated on the glass support on which the LTHC layer has been formed, and they may be UV cured. The method for carrying out the IR laser release step using LTHC made by 3M is disclosed, for example, in Japanese Patent No. 4565804 described above.

The mechanical release step includes, for example, horizontally fixing the processed wafer with the wafer facing downward so as to insert a blade into the end of the interface of the processed wafer to make an opening between the wafer and the support and after inserting the blade, applying upward stress to the support and/or the blade on the upper side to extend the opening to release the wafer from the support. Such a release step is disclosed in, for example, Japanese Patent No. 6377956 and Japanese Patent Laid-Open No. 2016-106404.

Any of the above release methods may be used for releasing the composition according to the embodiment of the present invention. It is preferable that in these cases, one end of the wafer of the processed wafer or the support be horizontally fixed and then a blade be inserted thereinto, or the periphery of the adhesive layer be swollen using a solvent (e.g., aliphatic or an aromatic hydrocarbon solvents such as pentane, hexane, heptane, octane, nonane, decane, benzene, toluene, xylene and mesitylene) to cause release, and the other end be lifted at a certain angle in the horizontal direction. Although these methods are usually performed at room temperature, heating at an upper limit of about 90° C. is also preferred. When laser is used, YAG laser or $YVO_4$ laser is preferably used.

When the above step (e) for releasing the processed wafer from a support is a mechanical release step, it is preferable that the step further may include the steps of:
(f) adhering dicing tape on the wafer surface of a processed wafer,
(g) vacuum sucking the side of the dicing tape to the suction surface, and
(h) releasing the support from the processed wafer at a temperature of the suction surface ranging from 10 to 100° C. This facilitates release of the support from the processed wafer and makes it easier to perform the subsequent dicing step.

When the release is performed with UV laser or IR laser, the production method may preferably further comprise the steps of:
(i) setting and fixing a processed wafer at a horizontal position with an optically transparent support facing upward preferably via dicing tape, and
(j) scanning of the entire surface of the processed wafer with laser from the side of the support.

This facilitates release of the support from the processed wafer and makes it easier to perform the subsequent dicing step.

The step (e) for releasing the processed wafer from the support with UV laser or IR laser may perform a subsequent step of:
(k) removing the temporary bonding agent remaining on the surface of the wafer.

The method for removing the temporary bonding agent includes a method in which the thinned side is vacuum sucked on the suction surface, while an adhesive tape such as dicing tape is attached to the entire surface of the other side on which the temporary bonding agent is remaining to peel the temporary bonding agent together with the tape, and a method in which the wafer is immersed in a solvent (e.g., aliphatic or aromatic hydrocarbon solvents such as pentane, hexane, heptane, octane, nonane, decane, benzene, toluene, xylene and mesitylene) and the adhesive layer is swollen to cause release. Of these methods, the tape release method is preferable from the viewpoints of fewer numbers of steps and short time required.

The wafer after the temporary bonding agent is removed may be sent to the subsequent step without washing the surface. It is preferable that when the surface is to be washed, the method may comprises:
a step (l) for washing the wafer from which the support and the temporary bonding agent have been removed using a solvent (e.g., aliphatic or aromatic hydrocarbon solvents such as pentane, hexane, heptane, octane, nonane, decane, benzene, toluene, xylene and mesitylene) be further performed with the circuit-bearing surface facing upward.

A part of the adhesive (temporary bonding agent) may remain on the circuit-bearing surface of the wafer from which the temporary bonding agent has been removed in the step (k). While it is preferable that the support released be washed and reused, residue of adhesive may have been adhered on the surface of the support. Examples of methods for removing these residues of adhesive include a method in which the wafer and the support are immersed in a solvent (e.g., aliphatic or aromatic hydrocarbon solvents such as pentane, hexane, heptane, octane, nonane, decane, benzene, toluene, xylene and mesitylene), and the residual adhesive is swollen to cause release.

In an embodiment, when obtaining a cured body by curing the composition, various techniques as follows may be employed.

In the first technique, a layer of the composition for temporary bonding comprising the components (A) to (D) is cured, thereby enabling to obtain a single layer cured body.

The second technique is a technique in which a first layer comprising a composition for temporary bonding having a component (A-1), a component (A-2), a component (B), and a component (C) and does not have a component (D) and a second layer comprising a composition for temporary bonding having the components (A) to (D) are respectively prepared and cured, thereby obtaining a cured body having an integrated single layer or multilayer (multiple layers). This cured body is preferable in the aspects that a component concentration distribution in the thickness direction varies or a component concentration distribution varies in the upper side and the lower side in the thickness direction of the cured body. The variation in a component concentration distribution may be confirmed by quantitatively determining UV transmittances of the both sides of the cured body by the reflectometric spectroscopy described above. This technique may provide the effect for realizing the optimum curing by combining layers with different light transmission properties. In the curing described above, black light and UV-LED may be used as a light source (the same applies to the following techniques). Examples of black light include TUV-8271 (central wavelength 365 nm, intensity 10 mW/cm$^2$) made by TOYO ADTEC. Examples of UV-LED include H-4MLH200-V2-1S19 + specially designed mirror unit (wavelength 385±5 nm, intensity 350 mW/cm$^2$, condition: scan pitch from mirror unit edge 20 mm) made by HOYA CORPORATION, H-4MLH200-V3-1S19 + specially designed mirror unit (wavelength 395±5 nm, intensity 375 mW/cm$^2$, condition: work distance from mirror unit edge 20 mm) made by HOYA CORPORATION, and H-4MLH200-V4-1S19 + specially designed mirror unit (wavelength 405±5 nm, intensity 400 mW/cm, condition: work distance condition: work distance 20 mm) made by HOYA CORPORATION.

The third technique also enables to obtain a cured body having at least a partially integrated single layer by applying (e.g., application by spin coat) a component (D) on a cured layer comprising a component (A-1), a component (A-2), a component (B) and a component (C). In this case, a component concentration distribution varies in the thickness direction of the cured body. The component concentration distribution may quantitatively be determined by reflectometric spectroscopy of each layer to be determined as described above. This technique may provide the effect for precisely controlling UV absorption properties.

As the fourth technique, a multilayer cured body may be obtained by putting a layer of a commercial LTHC agent (light heat converting agent) on a layer comprising a component (A-1), a component (A-2), a component (B) and a component (C) and curing. This may provide an effect for easily obtaining a cured body.

The cured body obtained by the techniques described above may be provided as a structure in combination with an adherend.

The method for producing the structure described above include various examples. For example, the first production method may comprise a step for applying a first composition for temporary bonding having a component (A-1), a component (A-2), a component (B) and a component (C), and not having a component (D) on a wafer to cure partially, a step for applying a second composition for temporary bonding comprising the components (A) to (D) on the partially cured composition for temporary bonding, and a step for further putting a transparent substrate on the applied second composition for temporary bonding to photo-cure.

The second method for producing the structure may comprise a step for applying a first composition for temporary bonding having a component (A-1), a component (A-2), a component (B) and a component (C), and not having a component (D) on a wafer to cure partially as needed, a step for applying a second composition for temporary bonding comprising the components (A) to (D) on a transparent substrate to cure partially as needed, and a step for firmly attaching faces of the wafer and the transparent substrate respectively on which the composition for temporary bonding has been applied and then bonding by photo-curing.

The third method for producing the structure may comprise a step for applying a composition for temporary bonding having a component (A-1), a component (A-2), a component (B) and a component (C), and not having a component (D) on a wafer to cure partially as needed, a step for applying a LTHC layer on a transparent substrate and drying to cure, and a step for firmly attaching the face of the wafer on which the composition for temporary bonding has been applied and the face of the transparent substrate on which the LTHC layer has been applied and then bonding by photo-curing.

Apart from the composition for temporary bonding described above, the same composition as used for the composition for temporary bonding of the present invention may also be used as a raw material of a light heat converting (LTHC) layer which absorbs IR laser light and converts it to energy disclosed in Japanese Patent No. 4565804. Using the present composition as a component for the light heat converting (LTHC) layer may improve heat resistance thereof.

Another aspect of the present invention provides a method for producing a semiconductor wafer comprising a step for applying an adhesive for temporary bonding to a semiconductor wafer substrate and/or a support member to bond the semiconductor wafer substrate and the support member, a step for curing the adhesive for temporary bonding by irradiating with light having a wavelength of 350 to 700 nm (preferably 365 to 500 nm or 385 to 700 nm, more preferably 385 to 450 nm) to obtain a bonded body, and a step for irradiating the bonded body with leaser light having a wavelength of less than 385 nm (preferably laser light having a wavelength of 200 nm or more and a wavelength of less than 385 nm) to release the semiconductor wafer substrate. The present production methods have both steps for curing and releasing performed at room temperature, do not need to heat or cool a member, generally do not need to use a solvent and the like, and are simple with short takt time (cycle time), hence beneficial.

Further, the cured adhesive for temporary bonding may constitutes a single layer in the bonded body. It may simplify steps and reduce takt time.

For the adhesive for temporary bonding preferably used for the present production method, a temporary bonding agent usable comprises a photo radical polymerization initiator component (C) selected from UJV curable monomers and the absorbance and an TJV absorber component (D) selected from most preferable UV transmittance. The UV curable monomer herein refers to preferably a monofunctional (meth)acrylate or a polyfunctional (meth)acrylate, and most preferably the components (A-1) and (A-2). The UV curable monomer may further comprise the polyisobutene homopolymer and/or the polyisobutene copolymer (B), or a known resin composition used for the conventional adhesives for temporary bonding.

In a preferable embodiment, the composition comprises the preferable photo radical polymerization initiator component (C) and the UV absorber component (D) described above, thereby enabling a fast curing rate and a fast release rate to be compatible even the adhesive for temporary bonding is a single layer. Further, it is possible to notably reduce an uncured UV curable monomer component remaining on the cured body when UV-curing the adhesive for temporary bonding, thereby enabling heat resistance of the cured body to be improved and a volatile matter under vacuum to be reduced. More specifically, for example, it is possible to increase the temperature at which the mass reduction by heating reaches 2% when measuring Tg/DTA of the cured body. The adhesive for temporary bonding having a high heat resistance of the cured body and a reduced volatile matter under vacuum is extremely useful for the recent semiconductor manufacturing process.

EXAMPLES

Hereinafter the present invention will be described in more detail with reference to Examples, but the present invention is not limited thereto.

Experimental Examples

Experiments were carried out at 23° C. and a humidity of 50% unless otherwise specified. The curable resin compositions (hereinafter may be referred to as a liquid resin composition) having the composition (unit is the part by mass) shown in Tables 1, 2 and 4 were prepared and evaluated. The following compounds were selected as the components of the curable resin compositions described in Experimental Examples.

Composition

The following compounds were selected as the monofunctional acrylate (A-1) whose homopolymer has a Tg of −100° C. to 60° C.

Isostearyl acrylate ("ISTA" made by Osaka Organic Chemical Industry Ltd., glass transition temperature of homopolymer: −18° C., molecular weight 325)

2-Dodecyl-1-hexadecanyl acrylate "Light Acrylate DHD-A (DHD-A)" made by Kyoeisha Chemical Co., Ltd., glass transition temperature of the homopolymer: −23° C., molecular weight 465)

2-Tetradecyl-1-octadecanyl acrylate "Light Acrylate DOD-A (DOD-A)" made by Kyoeisha Chemical Co., Ltd., glass transition temperature of the homopolymer: −8° C., molecular weight 521)

2-decyl-1-tetradecanyl acrylate ("LIGHT ACRYLATE DTD-A" made by Kyoeisha Chemical Co., Ltd., glass transition temperature of homopolymer: −36° C.; also abbreviated to as "DTD-A", molecular weight 409)

The following compounds were selected as the polyfunctional acrylate (A-2).

Tricyclodecane dimethanol diacrylate ("NK ester A-DCP" made by Shin-Nakamura Chemical Co., Ltd.; also abbreviated to as "A-DCP", molecular weight 304)

The following compounds were selected as the polyisobutene homopolymer and/or the polyisobutene copolymer (B).

The following compound was selected as the polyisobutene homopolymer.

Oppanol N 50SF (made by BASF, polystyrene-equivalent weight average molecular weight (Mw): 565,000, molecular weight distribution 2.4)

The following compounds were selected as the polyisobutene-polystyrene block copolymer.

SIBSTAR 103T (polystyrene-polyisobutene-polystyrene triblock copolymer, made by Kaneka Corporation, polystyrene-equivalent weight average molecular weight (Mw): 100,000, molecular weight distribution 2.0, total mass ratio of polystyrene segments 30%)

EPION EP400V (made by Kaneka Corporation, acryl-modified polyisobutene on both terminals, polystyrene-equivalent weight average molecular weight (Mw): 17,000, molecular weight distribution 1.2)

The following compound was selected as the photo radical polymerization initiator (C).

Bis(2,4,6-trimethylbenzoyl)phenylphosphine oxide ("Irgacure 819" made by BASF)

The following compounds were selected as the UV absorber (D).

2-(2H-Benzotriazol-2-yl)-4,6-bis(1-methyl-1-phenylehtyl)phenol (Tinuvin 900 made by BASF, ADK STAB LA-24 made by ADEKA Corporation, EVERSORB 76/EVERSORB 234 made by Everlight Chemical Industrial Corp., molecular weight 447)

2-(2H-Benzotriazol-2-yl)-6-(1-methyl-1-phenylethyl)-4-(1,1,3,3-tetramethylbutyl)phenol (Tinuvin 928 made by BASF, EVERSORB 89/89FD made by Everlight Chemical Industrial Corp., molecular weight 442)

2-[2-Hydroxy-3-(3,4,5,6-tetrahydrophthalimide-methyl)-5-methylphenyl]benzotriazol (Sumisorb 250 made by Sumika Chemtex Company, Limited, molecular weight 389)

2-[4-[(2-Hydroxy-3-(2'-ethyl)hexyl)oxy]-2-hydroxyphenyl]-4,6-bis(2,4-dimethylphenyl)-1,3,5-triazine (Tinuvin 405 made by BASF, molecular weight 584)

2,4-Bis(2-hydroxy-4-butyloxyphenyl)-6-(2,4-bis-butyloxyphenyl)-1,3,5-triazine (Tinuvin 460 made by BASF, molecular weight 630)

The following compound is selected as the antioxidant.

4-((4,6-Bis(octylthio)-1,3,5-triazin-2-yl)amino)-2,6-di-t-butylphenol ("IRGANOX 565" made by BASF)

Preparation of Liquid Sample

Materials were mixed while heating at 80° C. to prepare a homogeneous mixture.

Preparation of Cured Sample Using Black Light

The liquid resin composition homogenized by the above mixing was sandwiched between PET films, pressed out to make the thickness down to 50 μm (sample for measuring elastic modulus to be described later was 0.5 mm), and cured in a condition of an integrated light intensity of 10,000 mJ/cm$^2$ to prepare a cured body. For curing, black light (central wavelength 365 nm, intensity 10 mW/cm$^2$, made by TOYO ADTEC TUV-8271) was used.

Preparation of Cured Sample Using 405 nm UV-LED

The liquid resin composition homogenized by the above mixing was sandwiched between PET films, pressed out to make the thickness down to 50 μm (sample for measuring elastic modulus to be described later was 0.5 mm), and cured in a condition of an integrated light intensity of 5,000 mJ/cm$^2$ to prepare a cured body. For curing, UV-LED (central wavelength 405 nm, intensity 100 mW/cm$^2$, HLDL-120V0-NWPSC made by CCS Inc.) was used.

Step for preparing sample for evaluating suitability for UV laser release process:

The liquid resin composition prepared was spin-coated on an 8-inch silicon wafer (diameter 200 mm×thickness 0.725 mm) in an automatic wafer bonder in a condition of having a thickness of 50 μm, and then bonded to an 8-inch glass wafer (diameter 201 mm×thickness 0.7 mm) in the same apparatus under a reduced pressure condition of 10 Pa. After bonding, the liquid resin composition was cured using any of the above UV light sources from the glass wafer side to obtain a bonded body. Subsequently, the side of the silicon wafer of the obtained bonded body was thinned down to a thickness of 50 μm by grinding and polishing and then heated for 1 hour under high temperature and reduced pressure environment of 250° C., 13 Pa.

Step for preparing sample for evaluating suitability for IR laser release/mechanical release process:

A 4-inch silicon wafer (diameter 100 mm×thickness 0.47 mm) was laminated with a 4-inch glass wafer (diameter 100 mm×thickness 0.7 mm) using the liquid resin composition prepared and the liquid resin composition was pressed out to spread to a thickness of 50 μm throughout the entire surface between the substrates and cured using any of the above light sources in a condition of an integrated light intensity of 5,000 to 10,000 mJ/cm$^2$ to prepare a sample for release and disassembling. The surface of the 4-inch glass wafer was irradiated with the light for curing.

Evaluation

Compatibility of materials of liquid resin composition ("Compatibility of materials", "Absorbance" in the Tables 1, 2 and 4):

The homogenized composition for temporary bonding by the above mixing was cooled to 23° C., and whether the homogeneous state was kept or not was observed. The absorbance (OD660) of a sample at a wavelength of 660 nm, which was put in a cell having a width of 10 mm in the direction of optical path length was measured using Ultraviolet-visible spectrophotometer V-650 made by JASCO Corporation. Those having an absorbance of less than 0.1 were rated as compatible and pass, and those having an absorbance of 0.1 or more and in which non-homogeneity such as phase separation was visually observed were rated as incompatible and failure. The absorbance is preferably less than 0.1 from the viewpoint of compatibility. The evaluations thereafter were omitted for Examples rated as "Failure". The same applies to below.

Viscosity ("Suitability for spin coating process," "Viscosity" in Tables 1, 2 and 4):

The viscosity of the liquid resin compositions which were kept homogeneous at 23° C. in the above "Compatibility of materials" was measured to evaluate suitability for spin coating on the upper surface of the substrate which is assumed to be used in an actual process. The viscosity was measured in a temperature condition of 23° C. using Rheometer MCR 302 made by Anton-Paar and cone plate CP 50-2. Those having a shear viscosity at 1 s$^{-1}$ of 1,000 mPa·s or more and less than 4,000 mPa·s were rated as excellent, those having a shear viscosity at 1 s$^{-1}$ of 4,000 mPa·s or more and 10,000 mPa·s or less, or those having a shear viscosity at 1 s$^{-1}$ of 100 mPa·s or more and less than 1,000 mPa·s were rated as pass, and those having a shear viscosity at 1 s$^{-1}$ of more than 10,000 mPa·s or more or less than 100 mPa·s were rated as failure. The viscosity is preferably 100 to 10,000 mPa·s from the viewpoint of suitability for the spin coating process. The evaluations thereafter were omitted for Examples rated as "Failure". The same applies to below.

Mass reduction ratio of cured body by heating ("Heat resistance 1", "Temperature at which mass of cured body is reduced by 2%" in Tables 1, 2 and 4):

Using 10 mg of the resulting cured body, the mass reduction ratio of the cured body by heating was measured by using a simultaneous thermogravimetry/differential thermal analyzer "TG-DTA2000SA" made by Bruker AXS while increasing temperature at a temperature increase rate of 10° C./minute from 30° C. to 350° C. under nitrogen atmosphere, and then at a temperature increase rate of 20° C./minutes from 350° C. to 800° C. in air stream. The temperature at which the mass of the cured body is reduced by heating by 2% is shown. Those whose mass was reduced by 2% at the point when the temperature reached 250° C. or more were rated as excellent; those whose mass was reduced by 2% at the point when the temperature reached 200° C. or more and less than 250° C. were rated as good; those whose mass was reduced by 2% at the point when the temperature reached at 150° C. or more and less than 200° C. were rated as pass; and those whose mass was reduced by 2% at the point before the temperature reached 150° C. were rated as failure. The temperature at which the mass of the cured body is reduced by heating by 2% is preferably 150° C. or more, and more preferably 250° C. or more from the viewpoint of suitability for high temperature steps for manufacturing a semiconductor. The evaluations thereafter were omitted for Examples rated as "Failure". The same applies to below.

Range of elastic modulus of cured body ("Heat resistance 2"•"Storage modulus at−50 to 250° C." in Tables 1, 2 and 4):

The dynamic viscoelasticity of cured body samples was measured using Viscoelastometer RSA-G2 made by TA Instruments Japan. The dynamic viscoelasticity was measured with a distance between chucks of 10 mm, a sample having the width of 8 mm and the thickness of 0.5 mm, at a strain of 0.1%, a tensile frequency of 1 Hz, a temperature increase rate of 3° C./min, and in a temperature range of −50 to 250° C. Samples with a storage modulus E' of 10 kPa or more in the entire range in the conditions were rated as pass and samples with a storage modulus E' of less than 10 kPa in some temperature range were rated as failure. The elastic modulus is preferably 10 kPa or more. The evaluations thereafter were omitted for Examples rated as "Failure". The same applies to below.

Adhesiveness at high temperature ("Adhesiveness in high temperature condition (250° C., 1h, reduced pressure 30 Pa)," "Width of color change in periphery" and "peeling due to heating" in Tables 1, 2 and 4):

A 4-inch silicon wafer (diameter 10 cm×thickness 0.47 mm) was laminated with a 4-inch glass wafer (diameter 10 cm×thickness 0.7 mm) using the liquid resin composition prepared. When laminating, the thickness of the resin composition was adjusted by using a mixture of the temporary bonding agent to which 0.1% by mass of silica particles made by UBE Exsymo Co., Ltd. (product name HIPRESICA TS N3N, average particle size 50 μm) were added and mixed. After laminating, the composition was cured in a condition of an integrated light intensity of 10,000 mJ/cm$^2$ to prepare a sample for evaluating adhesiveness in high temperature and reduced pressure conditions. The adhesive was applied to the entire surface of lamination. The surface of the 4-inch glass wafer was irradiated with black light. The sample prepared was put on a hot plate which had been previously heated at a predetermined temperature with the 4-inch silicon wafer facing downward to observe the width of the region of color change in the periphery in the direction of the center of the wafer, and occurrence of peeling which could be visually observed from the side of the glass. Under the reduced pressure of 30 Pa, the temperature of the hot plate was 250° C. and the time of continuing heating was 1 hour. In "Adhesiveness in high temperature condition (250° C., 1 h, reduced pressure 30 Pa)" in Tables, those with a width of the region of color change in the periphery in the direction of the center of 5 mm or less and without peeling in each temperature condition ("None" for "peeling due to heating" in Tables) were rated as pass, and those with a width of more than 5 mm and with peeling were rated as failure. The width of the region of color change in the periphery in the direction of the center is preferably 5 mm or less. The color change herein refers to a change in color observed by the change caused when the temporary bonding agent is released from a substrate of either glass or silicon.

(1) Simultaneous suitability for UV curing process•UV laser release ("Light transmittance" in Tables 1 and 2):

The obtained cured film having a thickness of 50 μm was measured for a light transmittance in a wavelength range from 200 nm to 450 nm. Those satisfying all the following conditions were rated as pass, whereas those satisfying only two or less of the following conditions were rated as failure.
1. Light transmittance in a wavelength region of 395 nm or more is 70% or more
2. Light transmittance in a wavelength region of 385 nm or more and less than 395 nm is 20% or more
3. Light transmittance in a wavelength region of 355 nm is 1% or less (1) Suitability for UV laser release process ("UV laser releasability", "Minimum value of time required for achieving complete release" in Tables 1, 2 and 4, and "UV laser irradiation conditions" in Table 3):

From the glass support side of the obtained 8-inch sample, an area of 210 mm-square on which the sample was fixed in the center was irradiated by scanning the entire surface of the sample with UV laser. Each condition shown in Table 3 as UV laser irradiation condition was sequentially applied to Examples in Table 1 respectively for the evaluations. UV laser QLA-355 (wavelength 350 nm) made by Quark Technology Co., Ltd. was used in the conditions shown under Condition Number 9 of Table 3 (Table 3 shows trials to investigate optimum conditions) at an output of 9.3 W, a pulse energy of 235 pJ, an energy density of 11968 mJ/cm$^2$, a frequency of 40 kHz, a beam diameter (spot diameter) of 50 μm, and a scan pitch of 50 μm with a scan speed of 20 m/s. For releasability after irradiation, those in a state where the adhesive strength disappeared so completely that the glass support slides (or moves) freely on the silicon wafer (adhesive strength=0) were defined as complete release, and suitability for the UV laser release process was evaluated based on the minimum value of time required for the UV laser irradiation process for achieving the state of complete release. Those having the minimum value of time required of less than 15 seconds were rated as excellent, those with 15 seconds or more and less than 30 seconds were rated as good, those with 30 seconds or more and less than 60 seconds were rated as pass, and those with 60 seconds or more were rated as failure.

(2) Evaluation of suitability for IR laser release process:

The method disclosed in Japanese Patent No. 4565804, for example, may be used in this method. Japanese Patent No. 4565804 discloses a method of using a light heat converting layer (LTHC layer) which absorbs light and converts it to energy described in, for example, Japanese Patent No. 4405246 in combination with a liquid resin composition. The LTHC layer is applied to the surface of the support and cured to be formed. Japanese Patent No. 4565804 discloses a method for disassembling a laminate by irradiating the laminate with YAG laser or semiconductor laser from the top, while fixing the laminate on a fixer with the support facing upward, which laminate is prepared by bonding the surface of the support on which an LTHC layer is formed to the surface of a silicon wafer on which a liquid resin composition has been spin-coated and irradiating the same with UV from the side of the support to be cured. The laminate is disassembled when the LTHC layer absorbs light energy from IR laser and converts it into heat, and the heat decomposes and vaporizes the adjacent resin layer, and the layer of gas formed by vaporization causes the adhesive strength between the support and the resin layer to disappear. The releasability after IR laser irradiation may be evaluated by the same method as the above evaluation of the releasability after UV laser irradiation.

(3) Suitability for mechanical release process ("Mechanical Releasability (Pass/Failure)" in Tables 1 and 2):

Releasability was evaluated by a method in which a PET sheet was inserted between both substrates of the same sample as the above sample for evaluating adhesiveness at high temperature and the sample was attached to dicing tape ("ERK-3580" made by Denka Company Limited) with the side of the silicon wafer facing downward. A suction cup having a diameter of 50 mm was attached to the end of the sample while the sample was placed on and fixed to a vacuum chuck, the measurement unit of an electronic spring scale was attached to the center of the suction cup and the scale was vertically raised up. Those in which the strength required for release (release strength) was more than 50 N and those into which a PET sheet could not be inserted were rated as failure.

TABLE 1

|  |  |  | Example 1 | Example 2 | Example 3 | Example 4 | Example 5 | Example 6 | Example 7 |
|---|---|---|---|---|---|---|---|---|---|
| Component (A-1) | ISTA |  | 60 | 60 | 60 | 60 | 60 | 60 | 60 |
|  | DHD-A |  | — | — | — | — | — | — | — |
|  | DOD-A |  | — | — | — | — | — | — | — |
|  | DTD-A |  | — | — | — | — | — | — | — |
| Component (A-2) | A-DCP |  | 30 | 30 | 30 | 30 | 30 | 30 | 30 |
| Component (B) | SIBSTAR 103T | Mw: 100,000 | 10 | 10 | 10 | 10 | 10 | 10 | 10 |
|  | Oppanol N50SF | Mw: 565,000 | — | — | — | — | — | — | — |
|  | EPION EP400V | Mw: 17,000 | — | — | — | — | — | — | — |
| Component (C) | Irgacure 819 |  | 0.5 | 0.5 | 0.5 | 0.5 | 0.5 | 0.5 | 0.5 |
| Component (D) | Tinuvin 900/ADK STAB LA-24/ EVERSORB 76/EVERSORB 234 |  | — | — | 2 | — | — | — | — |
|  | Tinuvin 928/EVERSORB 89/89FD |  | — | — | — | 2 | — | — | — |
|  | Sumisorb 250 |  | — | — | — | — | 2 | — | — |
|  | Tinuvin 405 |  | — | — | — | — | — | 2 | — |
|  | Tinuvin 460 |  | 1.5 | 1.5 | — | — | — | — | 2 |

TABLE 1-continued

| | | | Example 1 | Example 2 | Example 3 | Example 4 | Example 5 | Example 6 | Example 7 |
|---|---|---|---|---|---|---|---|---|---|
| Antioxidant | IRGANOX 565 | | — | 1 | — | — | — | — | — |
| Compatibility of materials | | | Pass | Pass | Pass | Pass | Pass | Pass | Pass |
| Absorbance | | | <0.1 | <0.1 | <0.1 | <0.1 | <0.1 | <0.1 | <0.1 |
| Suitability for spin coating process | | | Excellent | Excellent | Excellent | Excellent | Excellent | Excellent | Excellent |
| Viscosity (mPa · s) | | | 1200 | 1200 | 1200 | 1200 | 1200 | 1200 | 1200 |
| Cured sample preparation | 365 nm | Black light | ◯ | ◯ | ◯ | ◯ | ◯ | ◯ | ◯ |
| | 405 nm | UV-LED | | | | | | | |
| Heat resistance 1 | | | Excellent | Excellent | Excellent | Excellent | Excellent | Excellent | Excellent |
| Temperature at which mass of cured body is reduced by 2% (° C.) | | | 255 | 261 | 269 | 277 | 262 | 304 | 294 |
| Heat resistance 2 | | | Pass | Pass | Pass | Pass | Pass | Pass | Pass |
| Storage modulus at −50 to 250° C. (kPa) | | | >10 | >10 | >10 | >10 | >10 | >10 | >10 |
| Adhesiveness in high temperature condition (250° C., 1 h, reduced pressure 30 Pa) | | | Pass | Pass | Pass | Pass | Pass | Pass | Pass |
| Width of color change in periphery (mm) | | | <5 | <5 | <5 | <5 | <5 | <5 | <5 |
| Peeling due to heating | | | None | None | None | None | None | None | None |
| Simultaneous suitability for UV curing process × UV laser release process | | | Pass | Pass | Pass | Pass | Pass | Pass | Pass |
| Light transmittance (%) | Minimum value in wavelength region of 395 nm or more | | 82.1 | 82.1 | 76.8 | 71.4 | 85.2 | 95.2 | 71.6 |
| | Minimum value in wavelength region of 385 nm or more and less than 395 nm | | 40.6 | 40.6 | 29.4 | 22.1 | 43.7 | 86.2 | 27.3 |
| | 355 nm | | 0.0 | 0.0 | 0.1 | 0.0 | 0.0 | 0.6 | 0.0 |
| UV Laser releasability | | | Good | Good | Excellent | Excellent | Excellent | Excellent | Excellent |
| Minimum value of time required for achieving complete release (s) | | | 18 | 18 | 12 | 12 | 12 | 12 | 12 |
| Mechanical releasability (Pass/Failure) | | | Pass | Pass | Pass | Pass | Pass | Pass | Pass |

* Values for component amounts indicate part by mass.

TABLE 2

| | | | Example 8 | Example 9 | Example 10 | Example 11 |
|---|---|---|---|---|---|---|
| Component (A-1) | ISTA | | 75 | — | 60 | 45 |
| | DHD-A | | — | 48.75 | — | — |
| | DOD-A | | — | 16.25 | — | — |
| | DTD-A | | — | — | — | — |
| Component (A-2) | A-DCP | | 20 | 30 | 30 | 30 |
| Component (B) | SIBSTAR 103T | Mw: 100,000 | — | — | 10 | — |
| | Oppanol N50SF | Mw: 565,000 | 5 | 5 | — | — |
| | EPION EP400V | Mw: 17,000 | — | — | — | 25 |
| Component (C) | Irgacure 819 | | 0.5 | 0.5 | 0.5 | 0.5 |
| Component (D) | Tinuvin 900/ADK STAB LA-24/ EVERSORB 76/EVERSORB 234 | | — | — | — | — |
| | Tinuvin 928/EVERSORB 89/89FD | | — | — | — | — |
| | Sumisorb 250 | | — | — | — | — |
| | Tinuvin 405 | | — | — | — | — |
| | Tinuvin 460 | | 1 | 2 | 2 | 2 |
| Antioxidant | IRGANOX 565 | | — | — | — | — |
| Compatibility of materials | | | Pass | Pass | Pass | Pass |
| Absorbance | | | <0.1 | <0.1 | <0.1 | <0.1 |
| Suitability for spin coating process | | | Pass | Pass | Excellent | Excellent |
| Viscosity (mPa · s) | | | 850 | 900 | 1200 | 1200 |
| Cured sample preparation | 365 nm | Black light | ◯ | ◯ | | |
| | 405 nm | UV-LED | | | ◯ | ◯ |
| Heat resistance 1 | | | Excellent | Good | Excellent | Excellent |
| Temperature at which mass of cured body is reduced by 2% (° C.) | | | 252 | 248 | 302 | 290 |
| Heat resistance 2 | | | Pass | Pass | Pass | Pass |
| Storage modulus at −50 to 250° C. (kPa) | | | >10 | >10 | >10 | >10 |
| Adhesiveness in high temperature condition (250° C., 1 h, reduced pressure 30 Pa) | | | Pass | Pass | Pass | Pass |
| Width of color change in periphery (mm) | | | <5 | <5 | <5 | <5 |
| Peeling due to heating | | | None | None | None | None |
| Simultaneous suitability for UV curing process × UV laser release process | | | Pass | Pass | Pass | Pass |
| Light transmittance (%) | Minimum value in wavelength region of 395 nm or more | | 84.8 | 72.8 | 71.6 | 71.8 |
| | Minimum value in wavelength region of 385 nm or more and less than 395 nm | | 59.0 | 28.2 | 27.3 | 27.5 |
| | 355 nm | | 0.0 | 0.0 | 0.0 | 0.0 |

TABLE 2-continued

| | | | | | |
|---|---|---|---|---|---|
| UV Laser releasability | | Good | Excellent | Excellent | Good |
| Minimum value of time required for achieving complete release (s) | | 28 | 12 | 12 | 28 |
| Mechanical releasability (Pass/Failure) | | Pass | Pass | Pass | Pass |

| | | | Example 12 | Example 13 | Example 14 |
|---|---|---|---|---|---|
| Component (A-1) | ISTA | | 45 | — | — |
| | DHD-A | | — | — | — |
| | DOD-A | | — | — | — |
| | DTD-A | | — | 45 | 40 |
| Component (A-2) | A-DCP | | 30 | 30 | 35 |
| Component (B) | SIBSTAR 103T | Mw: 100,000 | — | — | — |
| | Oppanol N50SF | Mw: 565,000 | — | — | — |
| | EPION EP400V | Mw: 17,000 | 25 | 25 | 25 |
| Component (C) | Irgacure 819 | | 0.2 | 0.2 | 0.2 |
| Component (D) | Tinuvin 900/ADK STAB LA-24/ EVERSORB 76/EVERSORB 234 | | — | — | — |
| | Tinuvin 928/EVERSORB 89/89FD | | — | — | — |
| | Sumisorb 250 | | — | — | — |
| | Tinuvin 405 | | — | — | — |
| | Tinuvin 460 | | 2 | 2 | 2 |
| Antioxidant | IRGANOX 565 | | — | — | — |
| Compatibility of materials | | | Pass | Pass | Pass |
| Absorbance | | | <0.1 | <0.1 | <0.1 |
| Suitability for spin coating process | | | Excellent | Pass | Pass |
| Viscosity (mPa · s) | | | 1200 | 500 | 600 |
| Cured sample preparation | 365 nm | Black light | ○ | ○ | ○ |
| | 405 nm | UV-LED | | | |
| Heat resistance 1 | | | Excellent | Excellent | Good |
| Temperature at which mass of cured body is reduced by 2% (° C.) | | | 250 | 255 | 245 |
| Heat resistance 2 | | | Pass | Pass | Pass |
| Storage modulus at −50 to 250° C. (kPa) | | | >10 | >10 | >10 |
| Adhesiveness in high temperature condition (250° C., 1 h, reduced pressure 30 Pa) | | | Pass | Pass | Pass |
| Width of color change in periphery (mm) | | | <5 | <5 | <5 |
| Peeling due to heating | | | None | None | None |
| Simultaneous suitability for UV curing process × UV laser release process | | | Pass | Pass | Pass |
| Light transmittance (%) | Minimum value in wavelength region of 395 nm or more | | 70.7 | 70.6 | 70.2 |
| | Minimum value in wavelength region of 385 nm or more and less than 395 nm | | 26.3 | 26.5 | 26.2 |
| | 355 nm | | 0.0 | 0.0 | 0.0 |
| UV Laser releasability | | | Good | Good | Pass |
| Minimum value of time required for achieving complete release (s) | | | 28 | 28 | 49 |
| Mechanical releasability (Pass/Failure) | | | Pass | Pass | Pass |

* Values for component amounts indicate part by mass.

TABLE 3

Apparatus: QLA-355 made by Quark Technology Co., Ltd.
UV Laser irradiation conditions

| | Condition Number | | | | | | | | |
|---|---|---|---|---|---|---|---|---|---|
| | 1 | 2 | 3 | 4 | 5 | 6 | 7 | 8 | 9 |
| Work distance (mm) | 692 | 692 | 692 | 692 | 692 | 692 | 692 | 692 | 692 |
| Output (W) | 9.3 | 9.3 | 9.3 | 9.3 | 9.3 | 9.3 | 9.3 | 9.3 | 9.3 |
| Pulse energy (μJ) | 235 | 235 | 235 | 235 | 235 | 235 | 235 | 235 | 235 |
| Energy density (mJ/cm2) | 11968 | 11968 | 11968 | 11968 | 11968 | 11968 | 11968 | 11968 | 11968 |
| Spot diameter (μm) | 50 | 50 | 50 | 50 | 50 | 50 | 50 | 50 | 50 |
| Frequency (kHz) | 40 | 40 | 40 | 40 | 40 | 40 | 40 | 40 | 40 |
| Scan pitch (μm) | 100 | 150 | 200 | 250 | 300 | 350 | 400 | 450 | 500 |
| Scan speed (m/s) | 4 | 6 | 8 | 10 | 12 | 14 | 16 | 18 | 20 |
| 210 mm-square scanning time required (s) | 110.8 | 49.2 | 27.7 | 17.7 | 12.3 | 9.0 | 6.9 | 5.5 | 4.4 |
| Determination | Failure | Pass | Good | Good | Excellent | Excellent | Excellent | Excellent | Excellent |

TABLE 4

| Part by mass | | | Comparative Example 1 | Comparative Example 2 | Comparative Example 3 | Comparative Example 4 | Comparative Example 5 |
|---|---|---|---|---|---|---|---|
| Component (A-1) | ISTA | | | | 95 | 90 | 80 |
| Component (A-2) | A-DCP | | 95 | 95 | | | 20 |
| Component (B) | Oppanol N50SF | Mw: 565,000 | 5 | | 5 | | |
| | SIBSTAR 103T | Mw: 100,000 | | 5 | | 10 | |
| Component (C) | Irgacure 819 | | 0.5 | 0.5 | 0.5 | 0.5 | 0.5 |
| Component (D) | Tinuvin 460 | | 2 | 2 | 2 | 2 | 2 |
| Compatibility of materials | | | Failure | Failure | Pass | Pass | Pass |
| Absorbance | | | ≥0.1 | ≥0.1 | <0.1 | <0.1 | <0.1 |
| Suitability for spin coating process | | | — | — | Excellent | Excellent | Failure |
| Viscosity (mPa · s) | | | — | — | 3000 | 3000 | <100 |
| Heat resistance 1 | | | — | — | Pass | Pass | — |
| Temperature at which mass of cured body is reduced by 2% (° C.) | | | — | — | 159 | 163 | — |
| Heat resistance 2 | | | — | — | Failure | Failure | — |
| Storage modulus lowest value at −50 to 250° C. (kPa) | | | — | — | <10 | <10 | — |
| Adhesiveness in high temperature condition (250° C., 1 h, reduced pressure 30 Pa) | | | — | — | — | — | — |
| Width of color change in periphery (mm) | | | — | — | — | — | — |
| Peeling due to heating | | | — | — | — | — | — |
| UV Laser releasability | | | — | — | — | — | — |
| Minimum value of time required for achieving complete release (s) | | | — | — | — | — | — |

* Values for component amounts indicate part by mass.

The results of Examples in Tables 1 and 2 and Comparative Examples in Table 4 show that the resin composition of the present invention has excellent compatibility, suitability for spin coating process and heat resistance.

When (A-1) is not used and only (A-2) was used as the monomer, (B) was separated and the resultant mixture was not compatible (Comparative Examples 1 and 2).

When (A-2) is not used and all monomers are (A-1), the composition does not have heat resistance required (Temperature at which mass of cured body is reduced by 2%, elastic modulus) (Comparative Examples 3 and 4). When (B) is not used, the viscosity does not reach the bare minimum value (Comparative Example 5).

The results in Tables 1 and 2 show that the composition of the present invention has excellent UV laser releasability.

The resin composition of the present invention ensures compatibility of materials and the lowest necessary viscosity for spin coating process, and thus has excellent adhesiveness, heat resistance and releasability at room temperature and high temperature.

The resin compositions according to Examples have suitability for UV laser release process and suitability for mechanical release process. The compositions enabled release, when a thin and sharp metal blade for making an opening was inserted into the end of the interface of the substrates of the laminate of a silicon wafer and a glass support prepared by the method described in the above Example and the laminate was horizontally fixed with the glass support facing upward, and after inserting the blade, upward stress was applied to the support on the upper side to extend the opening to release the wafer from the support.

Furthermore, as a method for evaluating the energy required for release, a method called Maszara test was used, in which a thin and sharp blade was inserted thereinto as described above only for a certain distance and how far the opening was extended at that stage was measured. The sample bonded by using the liquid resin having the composition of Example 1 exhibits a sufficiently low value even in that test.

The resin compositions according to Examples are suitable for UV laser release processes. The silicon wafer/glass support laminate prepared by the method described in the above Example was fixed on a fixer with the silicon wafer facing downward and the laminate was irradiated with UV laser QLA-355 manufactured by Quark Technology Co., Ltd. at an output of 9.3 W, a frequency of 40 kHz, and with a scan pitch of 200 μm and a beam diameter of 50 μm from the side of the glass support. Then, the release strength was measured in the same manner as in the above (3) Evaluation of suitability for mechanical release process, and as a result the release strength before UV irradiation of 3 N was reduced to 0 N.

INDUSTRIAL APPLICABILITY

The composition provided by the present invention has excellent heat resistance, low outgas properties and releasability.

The composition of the present invention readily exhibits strong adhesiveness only by being irradiating with ultraviolet light or visible light in the manufacture of various electronic parts, optical parts and optical devices, and thus provides excellent operationability and productivity. Furthermore, the outgas from the cured body of the composition of the present invention is extremely small at a high temperature of 250° C. The composition of the present invention can be easily released after processing. Thus, various electronic parts, optical parts and optical devices obtained by bonding using the composition of the present invention can undergo a deposition process at a high temperature of more than 200° C. or baking coating at high temperature.

Surface mount for circuit substrates has been applied even to optical parts such as image censors in addition to electronic parts such as ICs, resistors and inductors. In these cases the components are sent to soldering reflow at high temperature. Nowadays, in particular zinc-free soldering requires tough temperature conditions for soldering reflow. In such a manufacturing process the step at which the composition of the present invention is used is required to withstand heat treatment at high temperature sufficiently in order to improve quality of optical parts and optical devices or to increase productivity and production yield. Optical parts and optical devices manufactured by using the composition of the present invention can withstand the heat treatment at high temperature sufficiently, and thus are industrially highly useful.

The invention claimed is:

1. A method for producing a semiconductor wafer, the method comprising the steps of:
    applying an adhesive for temporary bonding to a semiconductor wafer substrate and/or a support member to bond the semiconductor wafer substrate and the support member;
    curing the adhesive for temporary bonding by irradiating light having a wavelength of 350 nm to 700 nm to obtain a bonded body,
    wherein the cured adhesive satisfies all the following conditions:
    in a light transmittance of a film of the cured adhesive having a thickness of 50 μm, a light transmittance in a wavelength region of 395 nm or more among the wavelengths of a light source used for curing is 70% or more,
    in a light transmittance of a film of the cured adhesive having a thickness of 50 μm, a light transmittance in a wavelength region of 385 nm or more and less than 395 nm among the wavelengths of a light source used for curing is 20% or more, and
    in a light transmittance of a film of the cured adhesive having a thickness of 50 μm, a light transmittance at a wavelength of 355 nm of UV laser is 1% or less; and
    irradiating the bonded body with laser light having a wavelength of less than 385 nm to release the semiconductor wafer substrate, wherein
    the cured adhesive for temporary bonding constitutes a single layer in the bonded body.

* * * * *